(12) United States Patent
Martinis et al.

(10) Patent No.: US 12,361,306 B2
(45) Date of Patent: Jul. 15, 2025

(54) T-JOINT CONNECTOR FOR QUANTUM COMPUTING SYSTEMS

(71) Applicant: Google LLC, Mountain View, CA (US)

(72) Inventors: John Martinis, Santa Barbara, CA (US); Bob Benjamin Buckley, Santa Barbara, CA (US); Xiaojun Trent Huang, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 881 days.

(21) Appl. No.: 17/476,646

(22) Filed: Sep. 16, 2021

(65) Prior Publication Data

US 2022/0083892 A1   Mar. 17, 2022

Related U.S. Application Data

(60) Provisional application No. 63/079,241, filed on Sep. 16, 2020.

(51) Int. Cl.
*G06N 10/00* (2022.01)
*G06F 15/16* (2006.01)
*H10N 60/20* (2023.01)

(52) U.S. Cl.
CPC ............. *G06N 10/00* (2019.01); *G06F 15/16* (2013.01); *H10N 60/20* (2023.02)

(58) Field of Classification Search
CPC ........ G06N 10/00; G06F 15/16; H10N 60/20; H01R 9/03; H01R 12/714; H01R 12/77;
(Continued)

(56) References Cited

U.S. PATENT DOCUMENTS

| 5,386,344 A  * | 1/1995 | Beaman .................. H01R 12/79 |
| | | 361/776 |
| 5,433,631 A | 7/1995 | Beaman et al. |
| 10,319,896 B2 * | 6/2019 | Falcon .................... H10N 60/12 |
| 10,681,842 B1 * | 6/2020 | Hart ........................ H05K 7/205 |

(Continued)

FOREIGN PATENT DOCUMENTS

| EP | 0608549 | 8/1994 |
| JP | H01093081 | 4/1989 |

(Continued)

OTHER PUBLICATIONS

International Preliminary Report on Patentability for Application No. PCT/US2021/050621, mailed Mar. 30, 2023, 11 pages.

(Continued)

*Primary Examiner* — Nha T Nguyen
(74) *Attorney, Agent, or Firm* — DORITY & MANNING, P.A.

(57) ABSTRACT

A T-joint connector can be useful for connecting one or more flex circuit boards to quantum hardware including one or more qubits. The T-joint connector can include one or more flex circuit boards. Each of the one or more flex circuit boards can include one or more signal lines and one or more spring interconnects including a superconducting material. The one or more spring interconnects can be coupled to the one or more signal lines. The one or more spring interconnects can be configured to couple the one or more signal lines to one or more signal pads disposed on a mounting circuit board associated with the quantum hardware. The superconducting material can be superconducting at a temperature less than about 3 kelvin.

20 Claims, 10 Drawing Sheets

(58) Field of Classification Search
CPC ...... H01R 12/79; H01R 2201/06; H01R 4/68; H01R 13/03; H05K 7/20372
See application file for complete search history.

(56) References Cited

U.S. PATENT DOCUMENTS

| | | | |
|---|---|---|---|
| 2019/0006572 | A1 | 1/2019 | Falcon et al. |
| 2019/0027800 | A1* | 1/2019 | El Bouayadi ........ H05K 1/0221 |
| 2020/0403137 | A1* | 12/2020 | Lampert ................ G06N 10/00 |
| 2021/0066570 | A1* | 3/2021 | Luethi ................. H10N 60/805 |
| 2021/0076530 | A1* | 3/2021 | Hart ................... H05K 7/20781 |
| 2022/0231216 | A1* | 7/2022 | Yamaji ................... H10N 69/00 |
| 2023/0130578 | A1 | 4/2023 | Martinis |

FOREIGN PATENT DOCUMENTS

| | | |
|---|---|---|
| JP | H05299708 A | 11/1993 |
| JP | H05304224 A | 11/1993 |
| JP | H06523621 A | 2/1994 |
| JP | H08171965 | 7/1996 |

OTHER PUBLICATIONS

International Search Report and Written Opinion for Application No. PCT/US2021/050621, mailed Jan. 7, 2022, 15 pages.

Chow et al., "Pressure Contact Micro-Springs in Small Pitch Flip-Chip Packages", IEEE Transactions on Components and Packaging Technologies, vol. 29, No. 4, pp. 796-803.

Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.

Shubin et al., "Novel Packaging with Rematable Spring Interconnect Chips for MCM", 59th Electronic Components and Technology Conference, May 26-29, 2009, San Diego, California, 7 pages.

* cited by examiner

T-JOINT CONNECTOR FOR QUANTUM COMPUTING SYSTEMS

PRIORITY CLAIM

The present application claims the benefit of priority of U.S. Provisional Application Ser. No. 63/079,241, filed on Sep. 16, 2020, titled T-Joint Connector for Quantum Computing Systems, which is incorporated herein by reference.

FIELD

The present disclosure relates generally to quantum computing systems, and, more particularly, to T-joint connectors for use in quantum computing systems.

BACKGROUND

Quantum computing is a computing method that takes advantage of quantum effects, such as superposition of basis states and entanglement, to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$. The "0" and "1" states of a digital computer are analogous to the $|0\rangle$ and $|1\rangle$ basis states, respectively, of a qubit.

SUMMARY

Aspects and advantages of embodiments of the present disclosure will be set forth in part in the following description, or can be learned from the description, or can be learned through practice of the embodiments.

One example aspect of the present disclosure is directed to a T-joint connector for connecting one or more flex circuit boards to quantum hardware including one or more qubits. The T-joint connector can include one or more flex circuit boards. Each of the one or more flex circuit boards can include one or more signal lines and one or more spring interconnects including a superconducting material. The one or more spring interconnects can be coupled to the one or more signal lines. The one or more spring interconnects can be configured to couple the one or more signal lines to one or more signal pads disposed on a mounting circuit board associated with the quantum hardware. The superconducting material can be superconducting at a temperature less than about 3 kelvin.

Another example aspect of the present disclosure is directed to a method of operating a quantum computing system. The method can include transmitting a control pulse to one or more signal lines. The one or more signal lines can be disposed in one or more flex circuit boards. The method can include transmitting, by the one or more signal lines, the control pulse through the one or more flex circuit boards to a T-joint connector. The method can include transmitting the control pulse through the T-joint connector to a quantum board including quantum hardware. The method can include applying, by the quantum hardware, the control pulse to implement at least one quantum operation based at least in part on the control pulse.

Another example aspect of the present disclosure is directed to a quantum computing system. The quantum computing system can include one or more classical processors. The quantum computing system can include quantum hardware including one or more qubits. The quantum computing system can include a chamber mount configured to support the quantum hardware. The quantum computing system can include a vacuum chamber configured to receive the chamber mount and dispose the quantum hardware in a vacuum. The vacuum chamber can form a cooling gradient from an end of the vacuum chamber to the quantum hardware. The quantum computing system can include a plurality of flex circuit boards including one or more signal lines. Each of the plurality of flex circuit boards can be configured to transmit signals by the one or more signal lines through the vacuum chamber. The quantum computing system can include a T-joint connector that is configured to couple the plurality of flex circuit boards to the quantum hardware. The T-joint connector can include one or more spring interconnects including a superconducting material. The one or more spring interconnects can be coupled to the one or more signal lines. The one or more spring interconnects can be configured to couple the one or more signal lines to one or more signal pads disposed on a mounting circuit board associated with the quantum hardware. The superconducting material can be superconducting at a temperature less than about 3 kelvin.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
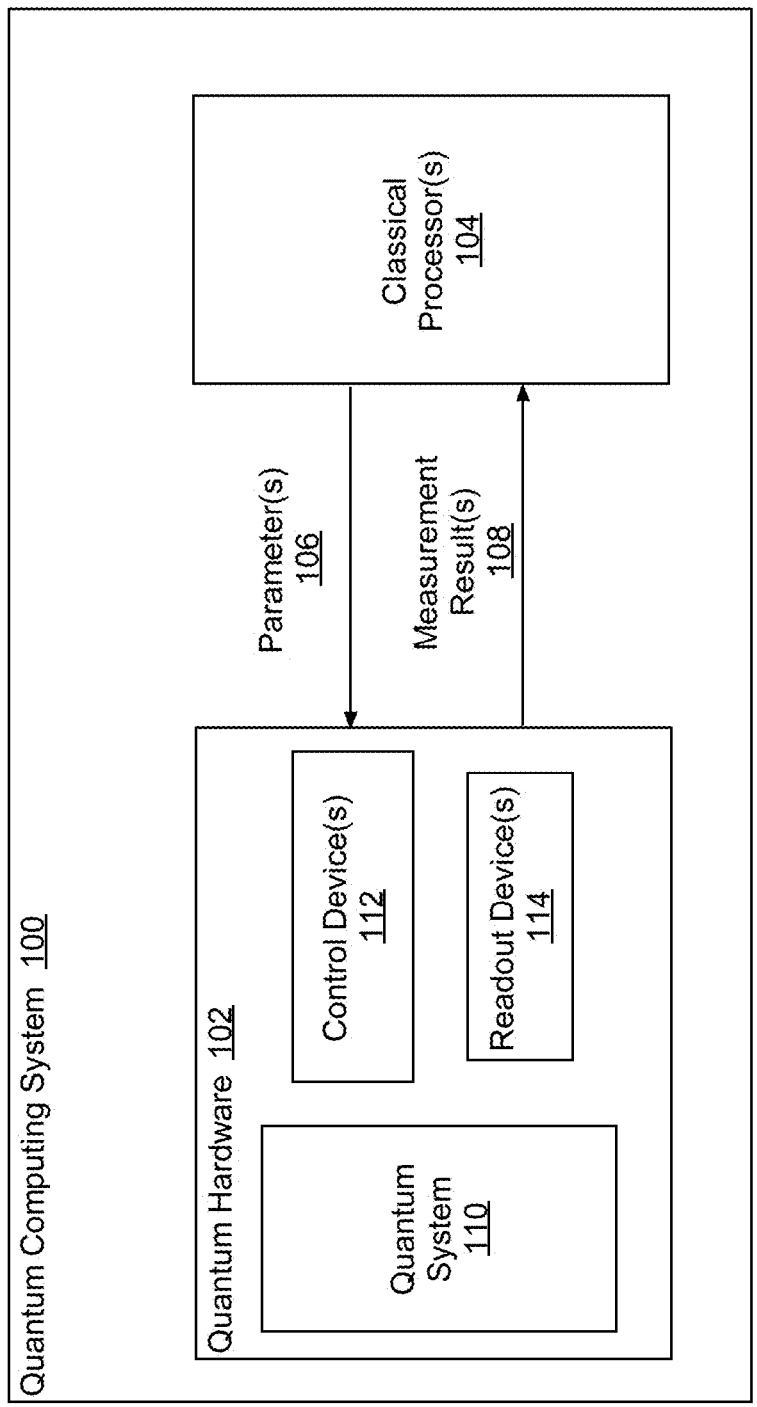
FIG. 1 depicts an example quantum computing system according to example embodiments of the present disclosure.

Example aspects of the present disclosure are directed to T-joint connectors, such as T-joint connectors useful in quantum computing systems having improved signal transmissions. One challenge in quantum computing relates to communications between a supercooled quantum system including quantum hardware (e.g., qubits) and a classical computing system (e.g., a binary computing system). Quantum computing systems can be at least partially controlled by a classical computing system. The classical computing system can be kept separate from the quantum hardware. For instance, the quantum hardware can be disposed in a vacuum chamber (e.g., in a vacuum formed by the vacuum chamber) and/or the classical computing system can be disposed outside of the vacuum chamber (e.g., outside of a vacuum formed by the vacuum chamber). The vacuum chamber may provide a temperature gradient between the classical computing system, which may operate at about room temperature, and the quantum hardware, which may operate at about absolute zero (e.g., less than about 10 millikelvin).

Quantum computing systems can require fast and robust communications between the classical computing system and the quantum system (e.g., qubits) to precisely and reliably implement quantum gate operations and/or quantum state measurements. To address this requirement, many systems employ physical signal lines, such as wires, between the classical computing system and quantum system.

Increasing complexity of quantum hardware (e.g., greater number of qubits) can present challenges with managing the physical signal lines between the classical computing system and quantum hardware. For instance, in some cases, each qubit can require one or more signal lines to transmit signals to and/or from the qubit. For instance, the number of required signal lines can grow at least near-linearly, if not greater than linearly, with the number of qubits in the quantum system. For instance, in some cases, four signal lines can be required for each qubit, even if some or all of the signal lines are multiplexed. Increasing density of quantum hardware can thus contribute to increasing density of signal lines and/or interconnects required between signal lines and components of the quantum computing system, such as the quantum hardware, an end (e.g., entrance) of the vacuum chamber, feed-throughs for different cooling stages, and/or other components. In addition, increasing complexity of quantum hardware can contribute to greater susceptibility to cross-talk, noise, interference, etc. Thus, the signal lines must provide sufficient performance for other considerations, such as thermal conductivity, noise and/or crosstalk robustness, and others.

As one example, many quantum computing applications employ superconducting qubits that achieve superconductivity, or zero electrical resistance, at a temperature around approximately absolute zero, or about 0 kelvin, such as less than about 3 kelvin. Thus, one challenge associated with quantum computing includes cooling quantum hardware with the superconducting qubits to a temperature at which the superconducting qubits achieve superconductivity. For example, in some cases, the superconducting qubits must be cooled to less than about 0.1 kelvin (K), such as less than about 0.02 kelvin, or 20 millikelvin (mK). Typically, the classical computing system can be maintained at a higher temperature than the quantum hardware such as, for instance, at about room temperature. Physical signal lines may connect to the quantum hardware and thus form a thermal conductor between the classical computing system and quantum hardware. The physical signal lines can reduce the efficiency of a cooling system (e.g., a cryogenic cooling system) that is configured to cool the quantum hardware and/or other components of the quantum computing system. While even one signal line can thus cause increased cooling requirements, this problem can become more significant as quantum hardware continues to grow in complexity. Thus, signal lines coupling the quantum hardware to the classical computing system can desirably be physically small (e.g., densely arranged), provide a low heat load, provide low electrical dissipation, and/or provide other desirable thermal characteristics.

As another example, it can be desirable to accurately drive qubits with signals from the signal lines. For instance, signal reflections caused by components of the quantum hardware (e.g., connectors) can negatively affect performance of the quantum hardware. Thus, the signal lines and/or other components (e.g., connectors) can desirably have low reflectivity (e.g., less than about 40 dB). Additionally and/or alternatively, the signal lines and/or other components (e.g., connectors) can desirably provide low distortion (e.g., pulse distortion) such that control signals are accurately transmitted through the signal line. Signal lines and/or other components (e.g., connectors) with low distortion can provide improved accurate control signal implementations and/or quantum algorithm execution at the quantum hardware and/or accurate readouts from the quantum hardware. Additionally and/or alternatively, the signal lines and/or other components (e.g., connectors) can desirably provide low crosstalk (e.g., less than about 80 dB) between distinct signal lines and/or other components. Signal lines and/or other components providing low crosstalk can provide improved isolated qubit communications, such as providing that signals on a signal line intended for one qubit are isolated from other qubits and/or contribute to reduced noise at each additional signal line.

As another example, noise and/or other external factors can impact performance of a quantum computing system. Signal lines coupling the quantum hardware to the classical computing system can desirably provide little interference in an environment of the quantum hardware. For example, signal lines can desirably emit few to no thermal photons and/or contribute to other factors that could interfere with operation of the quantum hardware. Additionally and/or alternatively, the quantum computing system can desirably block external thermal photons, signal noise, and/or other external factors from interfering with operation of the quantum hardware (e.g., by providing filtering).

Thus, some quantum computing systems can include one or more flex circuit boards including one or more signal lines. The flex circuit board(s) can be configured to transmit signals by the one or more signal lines (e.g., through a vacuum chamber) to couple one or more classical processors to quantum hardware. The flex circuit board(s) can include a plurality of signal lines and can provide a significantly improved signal line density, in addition to providing improved isolation, reduced thermal conductivity, and/or improved scalability. For instance, including flex circuit boards to couple the classical processors to the quantum hardware can provide for infrastructure that reliably scales to the increasingly greater numbers of qubits that are achieved and/or expected in contemporary and/or future quantum computing systems.

Including flex circuit board(s) in a quantum computing system can provide for improved signal communications within the quantum computing system. However, interfacing between the flex circuit board(s) and the quantum hardware can present challenges. For example, the signal lines may transition between the flex circuit board(s) and signal lines at a mounting board, such as a mounting board in communication with the quantum hardware. The mounting board may include signal traces having higher signal line density, such as significantly higher signal line density, than the flex circuit boards. This problem can be further compounded in cases where multiple flex circuit boards interface with a single mounting board, which can additionally contribute to increased signal line density at the mounting board.

In addition to handling increasing signal line density, a connection between the flex circuit board(s) and the mounting board can desirably maintain accuracy of signals transmitted through the connection. For instance, the connection can desirably have low distortion, crosstalk, reflectivity, etc. that could negatively affect integrity of signals communicated through the connection. In addition, many existing connectors fail to take advantage of superconducting properties available to certain materials at temperatures at which the connection between the flex circuit board(s) and the mounting board is made. These superconducting properties can be beneficial, especially in quantum computing applications.

Systems and methods according to example aspects of the present disclosure can provide solutions for these and/or other problems. According to example aspects of the present disclosure, a T-joint connector can be provided for connecting (e.g., interfacing between) one or more flex circuit boards and quantum hardware, such as quantum hardware including one or more qubits. For instance, the T-joint connector can be configured to couple one or more flex circuit boards to a mounting circuit board associated with the quantum hardware. For instance, the mounting circuit board may be or include a board upon which the quantum hardware is disposed and/or be in direct communication with a board having the quantum hardware. For example, the T-joint connector can be configured to connect multiple flex circuit boards perpendicularly to a single mounting circuit board. This can provide for a high-density interconnect suitable for connecting large numbers of signal lines (e.g., from multiple boards) to a single board having relatively high signal line density while maintaining desirable signal transmission characteristics.

The T-joint connector can include one or more flex circuit boards. Each of the flex circuit board(s) can include one or more signal lines. In some embodiments, the signal lines can be superconducting signal lines, such as signal lines including (e.g., made of) superconducting material, such as material that is superconducting (e.g., experiences superconductivity) at a temperature below about 3 kelvin, such as about 1 kelvin, such as about 20 millikelvin. For instance, in some embodiments, the flex circuit board(s) may each include at least one ground layer, at least one dielectric layer, and/or one or more signal lines. In some embodiments, the ground layer(s) and/or the signal line(s) may be or include superconducting material at a temperature of less than about 3 kelvin, such as aluminum, tin, niobium, molybdenum disulfide, BSCCO, etc.

The T-joint connector can include one or more spring interconnects. The spring interconnect(s) can be coupled to the signal line(s) and/or be in electrical communication (e.g., signal communication) with the one or more signal line(s). For instance, a spring interconnect can be coupled to a respective signal line. The spring interconnect(s) can couple the signal line(s) to the mounting circuit board, such as to one or more signal pads disposed on the mounting circuit board.

In some embodiments, some or all of the spring interconnect(s) can include a spring element. For instance, the spring element can be configured to contact a respective signal pad disposed on the mounting circuit board to couple the signal line to the signal pad. In some embodiments, the spring element may compress, bend, retract, or otherwise be disposed such that tension resulting from mating the T-joint connector with the mounting circuit board establishes firm contact between the spring element and the signal pad.

The spring interconnect(s) can include superconducting material, such as material that is superconducting (e.g., experiences superconductivity) at a temperature below about 3 kelvin, such as about 1 kelvin, such as about 20 millikelvin. For instance, in some embodiments, the spring element can include superconducting material. For example, in some embodiments, the spring element can be formed of superconducting material. Additionally and/or alternatively, in some embodiments, the spring element can include a superconducting coating of superconducting material. In some embodiments, the superconducting coating may include tin (e.g., as the superconducting material).

In some embodiments, the spring element(s) may be formed of non-superconducting material. Additionally and/or alternatively, in some embodiments, the spring element(s) can include beryllium copper (e.g., BeCu). For example, the spring element may be formed of non-superconducting material (e.g., beryllium copper) and coated with superconducting material (e.g., tin). In this way, the spring element can properly function as a spring using a material that has desirable mechanical properties (e.g., elasticity, tension, etc.) that may not be superconducting, while the superconducting coating can provide superconductivity, as the coating can be sufficient to provide superconductivity properties at the spring interconnect.

In some embodiments, the spring interconnect(s) can be disposed on a surface of the flex circuit boards. For instance, in some embodiments, the spring element can be attached to the flex circuit board by a signal pad, such as a solder pad. The signal pad can provide signal communications with the spring element. A via can extend from a signal line to the signal pad and/or the spring element. For example, the via can provide signal communications between the signal line and the spring element. In some embodiments, a gap can be provided between the signal pad and a ground layer to isolate the ground layer from the signal pad and/or the spring element.

In some embodiments, a plurality of spring interconnects can be spaced across a surface of the flex circuit board. For example, a line of spring interconnects can couple to a corresponding line of signal pads in a two-dimensional array of signal pads. In some embodiments, a first flex circuit board can include a plurality (e.g., a first plurality) of spring interconnects that are spaced across a surface of the first flex circuit board in a first direction. Additionally and/or alternatively, a second flex circuit board can be disposed parallel to the first flex circuit board. The second flex circuit board can be spaced apart from the first flex circuit board in a second direction. The second direction can be perpendicular to the first direction. Furthermore, in some embodiments, the second flex circuit board can include a plurality (e.g., a second plurality) of spring interconnects that are spaced across a surface of the second flex circuit board in the first direction. For instance, the plurality of spring interconnects spaced across the surface of the second flex circuit board can be parallel to and/or aligned with the plurality of spring interconnects spaced across the surface of the first flex circuit board.

The spring interconnect(s) can couple the signal line(s) to one or more signal pads disposed on a mounting circuit board. The mounting circuit board can be associated with the quantum hardware. For example, the quantum hardware can be disposed on the mounting circuit board and/or on a quantum board in direct communication with the mounting circuit board. The mounting circuit board may be a flex circuit board as described herein (e.g., formed of one or more flexible substrates) and/or may be a rigid circuit board. For instance, in some embodiments, the mounting circuit board can include at least a ground layer and a dielectric layer. The ground layer and/or the dielectric layer may be flexible and/or rigid. Additionally, a surface of the mounting circuit board opposite the ground layer can include one or more ground pads and/or one or more signal pads. For example, the surface opposite the ground layer can include a two-dimensional array of signal pads. Ground pads may be arranged to provide isolation between the signal pads. For instance, the ground pads may be arranged in spaces between the two-dimensional array of signal pads.

In some embodiments, the T-joint connector may be self-aligned. For example, various aligning systems such as shims, tabs, connector hardware, etc. may be used to align the flex circuit board(s) to the mounting circuit board and/or to align the spring elements to the signal pads. As one example, the flex circuit board(s) and/or spring interconnect(s) may be disposed in connector hardware configured to align the T-joint connector to a mating interface on the mounting circuit board. For instance, in some implementations, the T-joint connector can include a connector shell that is configured to encase at least a portion of the flex circuit board(s) in the T-joint connector. The connector shell can be configured to align the T-joint connector (e.g., the one or more flex circuit boards) to the mounting circuit board. For example, the connector shell can be received by mounting hardware on the mounting circuit board and/or proximate the mounting circuit board that couples with the connector shell to align the flex circuit board(s) to the mounting circuit board.

For instance, in some embodiments, the connector shell can include a first connector plate and a second connector plate. The first connector plate can be disposed parallel to the second connector plate and/or spaced apart from the second connector plate to define a volume therebetween. The volume can include, for example, the flex circuit board(s). For instance, the flex circuit boards can be disposed between the first connector plate and the second connector plate.

The first connector plate can be secured to the second connector plate. For instance, in some embodiments, the first connector plate can be secured to the second connector plate by screws, clamps, bolts, rods, pins, or any other suitable fasteners. In some embodiments, the T-joint connector can include one or more through holes extending through at least a portion of the T-joint connector. For instance, in some embodiments, the through holes can extend through the first connector plate, at least a portion of the flex circuit board(s), shim(s), and/or the second connector plate. In some embodiments, the through holes can extend through only an edge of the flex circuit boards (or not extend through the flex circuit boards) to prevent interference with signal lines. The through holes can be configured to receive a rod assembly (e.g., a screw, rod and bolt, etc.) to secure the first connector plate to the second connector plate.

In some embodiments, the T-joint connector can include one or more shims. The shim(s) can be configured to space components of the T-joint connector, such as to align and/or separate various components of the T-joint connector. As one example, a shim can be configured to space a first flex circuit board apart from a second flex circuit board. As another example, a shim can be configured to space a flex circuit board apart from a portion of connector hardware, such as the connector shell, such as a first connector plate and/or a second connector plate. In some embodiments, the shim(s) can be or can include non-conductive material.

In some embodiments, one or more tabs can extend from the shim(s). The tab(s) can be configured to space apart the spring interconnect(s). For instance, the shims may space spring interconnects that are spaced apart in a direction parallel to the flex circuit board(s) (e.g., spring interconnects on the same flex circuit board) and/or spring interconnects that are spaced apart in a direction perpendicular to the flex circuit board(s) (e.g., spring interconnects on different flex circuit boards). Additionally and/or alternatively, the tab(s) can be configured to align the spring interconnect(s) (e.g., the spring element(s)) to the signal pad(s). For instance, the tabs can be disposed between adjacent spring interconnects such that the spring interconnects are prohibited from forming electrical connections with components other than respective signal pads. Additionally and/or alternatively, the tabs can facilitate aligned contact between the spring interconnects (e.g., the spring element(s)) and the spring pads, such as by guiding the spring interconnects against a respective signal pad when the T-joint connector is mated with the mounting circuit board. In some embodiments, the tabs can be made of a same material as the shim(s), such as non-conductive material.

In some embodiments, the T-joint connector can include one or more isolation plates. The isolation plates can be configured to isolate (e.g., electrically isolate) components of the T-joint connector. For instance, an isolation plate may be disposed parallel to at least a portion of a flex circuit board, such as between two flex circuit boards and/or between a flex circuit board and the connector hardware. For instance, the isolation plates can isolate a first flex circuit board from a second flex circuit board and/or isolate a flex circuit board from external interference. Additionally and/or alternatively, an isolation plate may be included between the flex circuit board(s) and the mounting circuit board, such as parallel to the mounting circuit board. The isolation plate(s) may contact the mounting circuit board (e.g., ground pads) and/or another suitable ground such that the isolation plate(s) are grounded. In some embodiments, the isolation plate(s) may be attached to shim(s). In some embodiments, the isolation plate(s) can be or can include superconducting material, such as superconducting material below about 1 kelvin.

As used herein, a "flex circuit board" refers to a board including at least one generally planar substrate (e.g., layered substrates) or other support on which the one or more signal lines are formed or otherwise disposed and having flexibility in at least one plane. As used herein, "flexibility"

refers to a capability of deforming (e.g., subject to mechanical stress, etc.) without breaking. For example, a rectangular flex circuit board may be flexible along a largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board can include at least one ground layer. The ground layer can form an outer surface of the flex circuit board, such as an outer surface along the largest surface. In some embodiments, the flex circuit board can include two ground layers, such as two parallel and spaced apart ground layers. For instance, the two ground layers can form both largest outer surfaces of the flex circuit board. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature below about 3 kelvin, such as about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, the flex circuit board can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature less than about 3 kelvin, such as less than about 1 kelvin, such as less than about 20 millikelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board can include one or more vias. For instance, the vias can extend through the ground layer(s), the dielectric layer(s), and/or the signal line(s). The vias can serve to improve isolation of the signal lines. Additionally and/or alternatively, the vias can serve to couple multiple ground layers and/or transfer signals between layers of the flex circuit board. In some embodiments, the via(s) can be plated with via plate(s) that extend along the via(s). In some embodiments, the via plate(s) can be or can include conductive material, such as copper.

The quantum computing system can include quantum hardware in data communication with one or more classical processor(s). For instance, quantum hardware can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity at a temperature at or below about 3 kelvin, such as less than about 20 millikelvin. In some embodiments, the quantum computing system can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) can be configured to, in addition to any other suitable function(s) of the classical processor(s), control the quantum hardware. For instance, the classical processor(s) can be coupled to the quantum hardware (e.g., by signal lines included in flex circuit boards according to example aspects of the present disclosure) and/or configured to send control signals to perform quantum operations using the quantum hardware. As one example, the classical processor(s) can be configured to send control signals that implement quantum gate operations at the quantum hardware (e.g., by control device(s)). Additionally and/or alternatively, the classical processor(s) can be configured to send control signals that cause the quantum hardware to perform quantum state measurements and/or provide the quantum state measurements to the classical processor(s) (e.g., by readout device(s)). For example, the classical processor(s) can receive measurements of the quantum system that can be interpretable by the classical processor(s).

Systems and methods according to example aspects of the present disclosure can provide for a number of technical effects and benefits. For example, example aspects of the present disclosure can provide for a connector that can desirably provide for high-density interconnect between a plurality of flex circuit boards and a mounting circuit board. Additionally, the connector can provide for improved signal transfer characteristics through the connector, such as low signal distortion, low reflectivity, etc. For instance, the use of superconducting materials at the connector can provide for performance characteristics suitable for quantum computing applications. For example, the use of superconducting materials can provide for little to no contact resistance at the connector.

As used herein, the use of the term "about" or "approximately" in conjunction with a stated numerical value is intended to refer to within 10% of the stated numerical value.

Example aspects of the present disclosure are discussed herein with reference to a quantum computing system for purposes of illustration. Although systems and methods according to example aspects of the present disclosure may find particular advantages in quantum computing applications, such as quantum computing systems including flex circuit boards, it should be understood that the systems and methods described herein can be applied for other suitable applications.

With reference now to the FIGS., example embodiments of the present disclosure will be discussed in further detail.

FIG. 1 depicts an example quantum computing system 100. The example system 100 is an example of a system implemented as a classical or quantum computer program on one or more classical computers or quantum computing devices in one or more locations, in which the systems, components, and techniques described below can be implemented. FIG. 1 depicts an example quantum computing system that can be used to implement aspects of the present disclosure. Those of ordinary skill in the art, using the disclosures provided herein, will understand that other quantum computing structures or systems can be used without deviating from the scope of the present disclosure.

The system 100 includes quantum hardware 102 in data communication with one or more classical processor(s) 104. For instance, quantum hardware 102 can represent and/or manipulate information using qubits. A qubit can be or include any suitable quantum device that enables the superposition of multiple states, e.g., data in both the "0" and "1" state. As one example, a qubit can be or include a unit of superconducting material, such as superconducting material that achieves superconductivity at a temperature at or below about 20 mK.

The quantum hardware 102 can include components for performing quantum computation. For example, the quantum hardware 102 can include a quantum system 110, control device(s) 112, and readout device(s) 114 (e.g., readout resonator(s)). The quantum system 110 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 104 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 104 can be configured to, in addition to any other suitable function(s) of the classical processor(s) 104, control the quantum hardware 102. For instance, the classical processor(s) 104 can be coupled to the quantum hardware 102 (e.g., by signal lines) and/or configured to send control signals to perform quantum operations using the quantum hardware 102. As one example, the classical processor(s) 104 can be configured to send control signals that implement quantum gate operations at the quantum hardware 102 (e.g., by control device(s) 112). Additionally and/or alternatively, the classical processor(s) 104 can be configured to send control signals that cause the quantum hardware 102 to perform quantum state measurements and/or provide the quantum state measurements to the classical processor(s) 104 (e.g., by readout device(s) 114). For example, the classical processor(s) 104 can receive measurements of the quantum system 110 that can be interpretable by the classical processor(s) 104.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits.

Quantum circuits may be constructed and applied to the register of qubits included in the quantum system 110 via multiple signal lines (e.g., signal lines 120 of FIG. 2) that are coupled to one or more control devices 112. Example control devices 112 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines (e.g., signal lines 120 of FIG. 2) to generate magnetic fields to adjust a frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 110 through physical control parameters (e.g., microwave pulse) that are sent through wires included in the quantum hardware 102. Further examples of control devices include arbitrary waveform generators, wherein a DAC creates the signal.

The readout device(s) 114 may be configured to perform quantum measurements on the quantum system 110 and send (e.g., by signal lines 120 of FIG. 2) measurement results 108 to the classical processors 104. In addition, the quantum hardware 102 may be configured to receive data (e.g., by signal lines 120 of FIG. 2) specifying physical control parameter values 106 from the classical processors 104. The quantum hardware 102 may use the received physical control parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

The readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

The system 100 includes control device(s) 112. Control device(s) 112 can operate the quantum hardware 102. For example, control device(s) 112 can include a waveform generator configured to generate control pulses according to example aspects of the present disclosure.

In some implementations, the control device(s) 112 may include a data processing apparatus and associated memory. The memory may include a computer program having instructions that, when executed by the data processing apparatus, cause the data processing apparatus to perform one or more functions described herein, such as applying a control signal to a qubit and/or to a tunable coupler.

Figure 2:
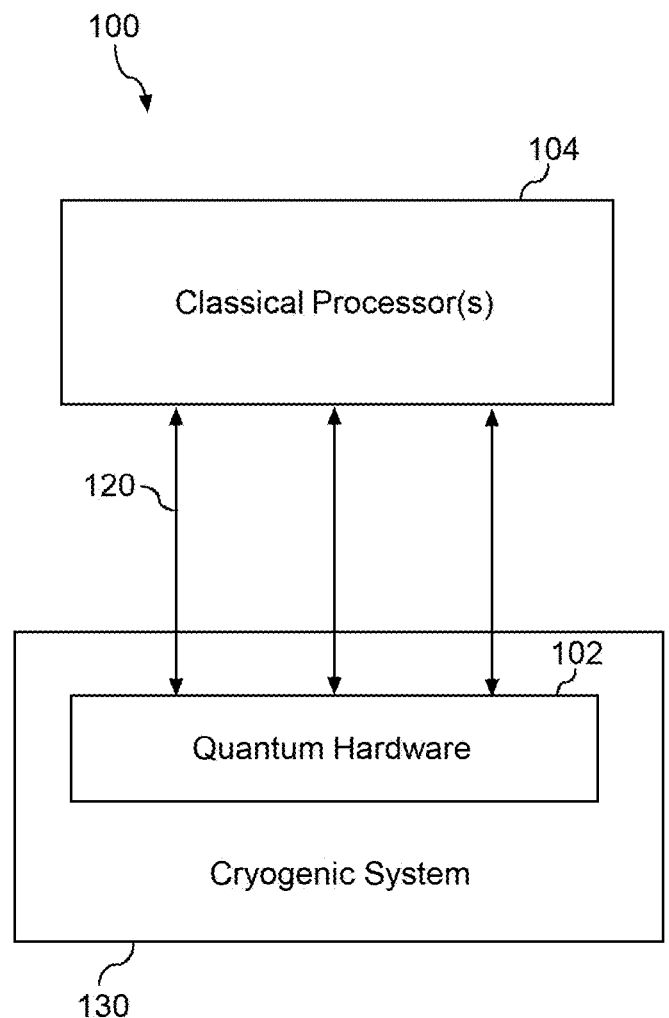
FIG. 2 depicts an example quantum computing system according to example embodiments of the present disclosure.

FIG. 2 depicts an example quantum computing system 100 according to example embodiments of the present disclosure. As illustrated in FIG. 2, quantum hardware 102, such as, but not limited to, quantum system 110, control device(s) 112, readout device(s) 114, and/or any other suitable components of quantum hardware 102 discussed with regard to FIG. 1, can be located within cryogenic cooling system 130. Additionally and/or alternatively, classical processor(s) 104 can be located outside cryogenic cooling system 130. Cryogenic cooling system 130 can be or can be located in a vacuum chamber. For example, the quantum hardware 102 and/or signal line(s) 120 (e.g., flex circuit boards) can be supported by a chamber mount that is configured to be inserted into a vacuum cannister to form a vacuum chamber. For instance, the chamber mount can be configured to dispose the quantum hardware 102 in a vacuum (e.g., formed by the vacuum chamber). The cryogenic cooling system 130 configured to provide a temperature gradient (e.g., a plurality of cooling stages) within the vacuum chamber. For example, a temperature gradient can be formed by a plurality of cryogenic cooling stages, such as stages of a dilution refrigerator. Example stages of a dilution refrigerator can be or can include, for example, a first intermediate clamp stage, a first stage pulse tube stage, a second intermediate clamp stage, a second stage pulse tube stage, a still stage, an intermediate heat exchanger stage, a mixing chamber stage, a Joule-Thompson cooling stage, a helium liquefier stage, and/or any other suitable stages of a dilution refrigerator.

Cryogenic cooling system 130 can be configured to cool quantum hardware 102. Additionally and/or alternatively, classical processor(s) 104 are not cooled by cryogenic cooling system 130. For instance, classical processor(s) 104 can operate at a temperature around room temperature (e.g., around 300 kelvin) and/or a temperature around about 100 kelvin, whereas quantum hardware 102 can operate at a temperature around absolute zero (e.g., less than about 1 kelvin) which can thus require cooling by cryogenic cooling system 130 to effectively operate.

Quantum computing system 100 can include signal line(s) 120. The signal line(s) 120 can couple classical processor(s) 104 to quantum hardware 102. For instance, as classical processor(s) 104 and quantum hardware 102 can be in signal communication, such as to transmit parameter(s) 106 and/or measurement result(s) 108 of FIG. 1 in addition to any other suitable signals, the classical processor(s) 104 can be coupled to quantum hardware 102 by signal lines 120. For instance, according to example aspects of the present disclosure, signal lines 120 can be or can include one or more flex circuit boards, such as superconducting flex circuit boards, that is/are configured to couple quantum hardware 102 and classical processor(s) 104. Generally, signal lines 120 include physical connections to allow for faster and/or more robust communication between quantum hardware 102 and classical processor(s) 104. As illustrated in FIG. 2, signal lines 120 can be at least partially located in cryogenic cooling system 130 to provide coupling to quantum hardware 102. Increasing density of signal lines 120 (e.g., associated with increasing complexity of quantum hardware 102) can present challenges in operating quantum computing system 100, which can be mitigated by the inclusion of flex circuit boards according to example aspects of the present disclosure.

Figure 3:
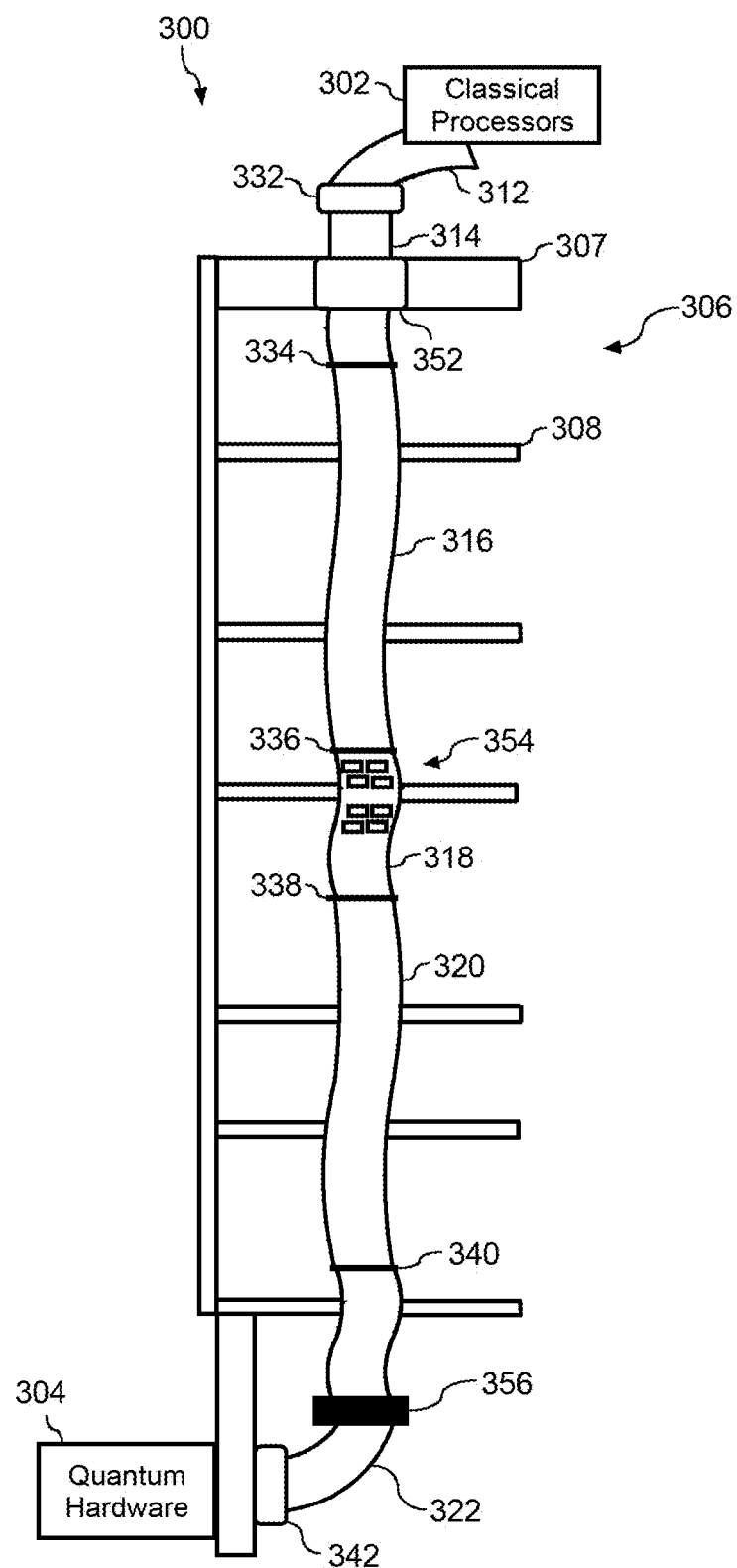
FIG. 3 depicts an example quantum computing system according to example embodiments of the present disclosure.

FIG. 3 depicts an example quantum computing system 300 according to example embodiments of the present disclosure. The quantum computing system 300 can include one or more classical processors 302 and quantum hardware 304 including one or more qubits. The quantum computing system 300 can include a chamber mount 308 configured to support the quantum hardware 304 and a vacuum chamber configured to receive the chamber mount 308 and dispose the quantum hardware 304 in a vacuum. The vacuum chamber can form a cooling gradient from an end of the vacuum chamber (e.g., cap 307) to the quantum hardware 304. For example, the vacuum chamber can form a cooling gradient from a first temperature, such as room temperature (e.g., about 300 kelvin) to a second temperature, such as at or about absolute zero (e.g., about 20 millikelvin), such as to provide a temperature at the quantum hardware 304 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

Figure 4:
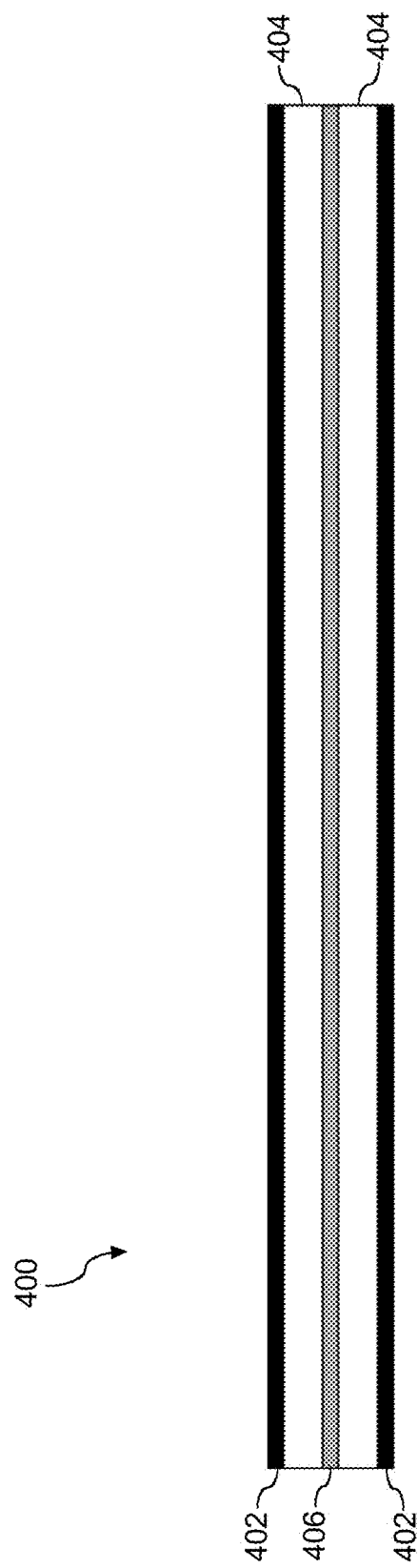
FIG. 4 depicts a cross-sectional view of an example flex circuit board according to example embodiments of the present disclosure.

The quantum computing system 300 can include one or more signal lines between the classical processor(s) 302 and quantum hardware 304. According to example aspects of the present disclosure, the quantum computing system 300 can include one or more flex circuit boards 306 including one or more signal lines. The flex circuit board(s) 306 can be configured to transmit signals by the one or more signal lines through the vacuum chamber to couple the one or more classical processors 302 to the quantum hardware 304. The flex circuit board(s) 306 can include a plurality of signal lines and can provide a significantly improved signal line density, in addition to providing improved isolation, reduced thermal conductivity, and/or improved scalability. For instance, including flex circuit boards 306 according to example aspects of the present disclosure to couple the classical processors 302 to the quantum hardware 304 can provide for infrastructure that reliably scales to the increasingly greater numbers of qubits that are achieved and/or expected in contemporary and/or future quantum computing systems. Example flex circuit boards that may be employed in accordance with example aspects of the present disclosure are illustrated in FIG. 4.

In some embodiments, some or all of the flex circuit board(s) 306 can include at least one ground layer. The ground layer can form an outer surface of the flex circuit board 306, such as an outer surface along the largest surface. In some embodiments, the flex circuit board 306 can include two ground layers, such as two parallel and spaced apart ground layers. For instance, the two ground layers can form both largest outer surfaces of the flex circuit board 306. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature less than about 3 kelvin, about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, the flex circuit board 306 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 306 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature at or below about 3 kelvin, such as about 1 kelvin, such as about 20 millikelvin. As examples, the signal line(s) can be or can include niobium, tin, aluminum, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board 306 can include one or more vias. For instance, the vias can extend through the ground layer(s), the dielectric layer(s), and/or the signal line(s). The vias can serve to improve isolation of the signal lines. In some embodiments, the via(s) can be plated with via plate(s) that extend along the via(s). In some embodiments, the via plate(s) can be or can include conductive material, such as copper.

For instance, in some embodiments, a quantum computing system 300 can include quantum hardware 304 in data communication with one or more classical processor(s) 302. For instance, quantum hardware 304 can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity at a temperature less than about 3 kelvin, such as less than about 1 kelvin, such as less than about 20 millikelvin. In some embodiments, the quantum computing system 300 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 302 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 302 can be configured to, in addition to any other suitable function(s) of the classical processor(s) 302, control the quantum hardware 304. For instance, the classical processor(s) 302 can be coupled to the quantum hardware 304 (e.g., by signal lines included in flex circuit boards 306 according to example aspects of the present disclosure) and/or configured to send control signals to perform quantum operations using the quantum hardware 304. As one example, the classical processor(s) 302 can be configured to send control signals that implement quantum gate operations at the quantum hardware 304 (e.g., by control device(s)). Additionally and/or alternatively, the classical processor(s) 302 can be configured to send control signals that cause the quantum hardware 304 to perform quantum state measurements and/or provide the quantum state measurements to the classical processor(s) 302 (e.g., by readout device(s)). For example, the classical processor(s) 302 can receive measurements of the quantum system that can be interpretable by the classical processor(s) 302.

According to example aspects of the present disclosure, the quantum computing system 300 can include one or more flex circuit boards 306 including one or more signal lines. The classical processor(s) 302 can be coupled to at least one first flex circuit board. For instance, the classical processor(s) 302 can be coupled to the first flex circuit board(s) 314 by a classical-flex interconnect 332. The classical-flex interconnect 332 can convert from a classical signal transmission medium (e.g., a coaxial cable) 312 to the first flex circuit board(s) 314.

As one example, the classical-flex interconnect 332 can be or can include a compression interposer. The compression interposer can include an array (e.g., a two-dimensional array) of spring pads. A connector receiving signals from the classical processor(s) 302, such as via one or more coaxial cables 312 (e.g., one coaxial cable 312 per signal line) can be compressed against the compression interposer to form signal communications between the spring pads and the connector (e.g., the coaxial cables). The spring pads can each be coupled to a signal line on the first flex circuit board 314 such that signals can be transmitted from the classical processor(s) 302 (e.g., the coaxial cables) to the signal lines. The compression interposer can provide for connecting signal transmission media 312 having a relatively lower spatial density, such as coaxial cables, which may occupy a relatively larger amount of space per cable, to signal transmission media having a relatively higher spatial density, such as signal lines embedded in a first flex circuit board 314 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 314 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 314 can include copper signal lines and/or ground layer(s) to provide high signal transfer performance characteristics.

The first flex circuit board(s) 314 can pass through a hermetic seal 352 positioned at an end (e.g., an entrance) of the vacuum chamber, such as cap 307. For example, a flex circuit board (e.g., first flex circuit board 314) can be configured to pass through the hermetic seal 352 such that a first portion of the flex circuit board (e.g., first flex circuit board 314) is disposed in the vacuum chamber and a second portion of the flex circuit board (e.g., first flex circuit board 314) is disposed outside of the vacuum chamber while the hermetic seal 352 forms a vacuum seal for the vacuum chamber. The hermetic seal 352 can provide for the first flex circuit board(s) 314 to enter the vacuum chamber without (e.g., substantially) destroying a vacuum created by the vacuum chamber. As one example, the hermetic seal 352 can include a fitted seal for each first flex circuit board 314. The fitted seal(s) can receive the first flex circuit board(s) 314 and form a vacuum seal with surface(s) of the first flex circuit board(s) 314. Additionally, the hermetic seal 352 can include one or more seal slots configured to receive the fitted seal(s) and/or the first flex circuit board(s) 314. For example, the fitted seal(s) can form a vacuum seal with the seal slot(s) while allowing the first flex circuit board(s) 314 to pass through the seal slot(s) and into the vacuum chamber. In this way, the flex circuit board(s) 306 can enter the vacuum chamber without experiencing signal disruptions from breaks in the circuit boards, as the boards can continuously pass into the vacuum chamber. In some embodiments, the hermetic seal 352 can include fastening systems to secure the fitted seals to the seal slots and/or form a vacuum seal, such as, for example, screws, bolts, seal rings, O rings, etc. In some embodiments, the hermetic seal 352 can form a vacuum seal without requiring adhesive material (e.g., glue, resin, etc.) such that, for example, residual adhesive material does not contaminate the flex circuit boards 306.

The first flex circuit board(s) 314 can be coupled to at least one second flex circuit board(s) 316. The first flex circuit board(s) 314 can be coupled to the second flex circuit board(s) 316 by at least one flex-flex interconnect 334. For instance, the flex-flex interconnect(s) 334 can couple (structurally and/or electrically) the ground layer(s), dielectric layer(s), and/or signal line(s) of a first flex circuit board 314 to a second flex circuit board 316. As examples, the flex-flex interconnect(s) 334 can be formed by soldering, welding, and/or otherwise fusing components of a first flex circuit board 314 to a second flex circuit board 316. The flex-flex interconnect(s) 334 can be or can include any suitable interconnection of two flex circuit board(s) 306 such as, for example, a butt joint, an overlap joint, and/or any other suitable interconnection(s).

The second flex circuit board(s) 316 can have at least a different material composition from the first flex circuit board(s) 314. In some embodiments, the second flex circuit board(s) 316 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 316 can include copper alloy signal lines and/or ground layer(s) to provide reduced thermal conductivity from the upper portions of the vacuum chamber (e.g., first circuit boards 314) and/or dispelling heat produced at subsequent components, such as surface mount attenuators 354.

In some embodiments, the second flex circuit board(s) 316 can be coupled to at least one surface mount attenuator board 318. For instance, the second flex circuit board(s) 316 can be coupled to the surface mount attenuator board(s) 318 by at least one flex-flex interconnect 336. For instance, the flex-flex interconnect(s) 336 can couple (structurally and/or electrically) the ground layer(s), dielectric layer(s), and/or signal line(s) of a second flex circuit board 316 to a surface mount attenuator board 318. As examples, the flex-flex interconnect(s) 336 can be formed by soldering, welding, and/or otherwise fusing components of a second flex circuit board 316 to a surface mount attenuator board 318. The flex-flex interconnect(s) 336 can be or can include any suitable interconnection of two flex circuit board(s) 306 such as, for example, a butt joint, an overlap joint, and/or any other suitable interconnection(s).

The surface mount attenuator board 318 can be a flexible printed circuit board. In some embodiments, the surface mount attenuator board(s) 318 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

The surface mount attenuator board(s) 318 can include one or more surface mount attenuators 354. The surface mount attenuator(s) 354 can be configured to attenuate or block thermal photon interference. In some embodiments, the surface mount attenuator board(s) 318 and/or the surface mount attenuator(s) 354 can be placed at a temperature cold enough such that the surface mount attenuator(s) 354 do not produce thermal photons. In some embodiments, the surface mount attenuator(s) 354 can be disposed in an isolation plate. The isolation plate can be configured to isolate the one or more surface mount attenuators. The isolation plate can be attached to the surface mount attenuator board(s) 318. In some embodiments, the isolation plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The quantum computing system 300 can include at least one third flex circuit board 320. For instance, the surface mount attenuator board(s) 318 can be coupled to the third flex circuit board(s) 320 by at least one flex-flex interconnect 338. For instance, the flex-flex interconnect(s) 338 can couple (structurally and/or electrically) the ground layer(s), dielectric layer(s), and/or signal line(s) of a surface mount attenuator board 318 to a third flex circuit board 320. As examples, the flex-flex interconnect(s) 338 can be formed by soldering, welding, and/or otherwise fusing components of a surface mount attenuator board 318 to a third flex circuit board 320. The flex-flex interconnect(s) 338 can be or can include any suitable interconnection of two flex circuit board(s) 306 such as, for example, a butt joint, an overlap joint, and/or any other suitable interconnection(s).

The third flex circuit board(s) 320 can be positioned at a point in the vacuum chamber at which the cooling gradient is cool enough such that some materials exhibit superconductivity. For example, at least a portion of the third flex circuit board(s) 320 can have a temperature of less than about three kelvin.

In some embodiments, the third flex circuit board(s) 320 can be or can include a third flex circuit board material at the ground layer(s) and/or the signal line(s). The third flex circuit board(s) 320 material can be selected to be superconducting at a temperature which at least a portion of the third flex circuit board(s) 320 experiences superconductivity. As examples, the third flex circuit board(s) 320 material can be or can include niobium, tin, aluminum, and/or other suitable superconducting materials. For instance, the third flex circuit board(s) 320 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 320 can be coupled to at least one fourth flex circuit board 322. The third flex circuit board(s) 320 can be coupled to the fourth flex circuit board(s) 322 by at least one flex-flex interconnect 340. For instance, the flex-flex interconnect(s) 340 can couple (structurally and/or electrically) the ground layer(s), dielectric layer(s), and/or signal line(s) of a third flex circuit board 320 to a fourth flex circuit board 322. As examples, the flex-flex interconnect(s) 340 can be formed by soldering, welding, and/or otherwise fusing components of a third flex circuit board 320 to a fourth flex circuit board 322. The flex-flex interconnect(s) 340 can be or can include any suitable interconnection of two flex circuit board(s) 306 such as, for example, a butt joint, an overlap joint, and/or any other suitable interconnection(s).

The fourth flex circuit board(s) 322 can couple the third flex circuit board(s) 320 to the quantum hardware 304. For example, a connector 342 at an end of the fourth flex circuit board(s) 322 can attach to a port that is in signal communication with the quantum hardware 304. As one example, the connector can be a T-joint connector, such as a T-joint connector including superconducting materials (e.g., tin). Additionally and/or alternatively, the connector 342 may be a planar spring array. An example T-joint connector that may be employed in accordance with example aspects of the present disclosure is illustrated in FIGS. 5-8.

In some embodiments, the fourth flex circuit board(s) 322 can be or can include a fourth flex circuit board material at the ground layer(s) and/or the signal line(s). The fourth flex circuit board(s) 322 material can be selected to provide high signal transfer performance characteristics. As examples, the fourth flex circuit board(s) 322 material can be or can include copper, brass, gold, and/or other suitable materials having high signal transfer performance characteristics. For instance, the fourth flex circuit board(s) 322 can include copper signal lines and/or ground layer(s) to provide high signal transfer performance characteristics. Additionally and/or alternatively, the fourth flex circuit board(s) 322 material can be selected to be superconducting at a temperature for which at least a portion of the fourth flex circuit board(s) 322 experiences superconductivity. As examples, the fourth flex circuit board(s) 322 material can be or can include niobium, tin, aluminum, and/or other suitable superconducting materials.

In some embodiments, the fourth flex circuit board(s) 322 can be or can include a filter 356, such as an XYZ and/or IR filter 356. For instance, the filter 356 can be configured to reduce effects of noise, thermal photons, and/or other potential sources of interference. As one example, the filter 356 can include a cavity in the fourth flex circuit board(s) 322 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter 356 can be bounded by one or more boundaries of a cavity within the fourth flex circuit board(s) 322 (e.g., a cavity within the dielectric material). For instance, a cavity within the fourth flex circuit board(s) 322 can be filled with a filter material (e.g., a magnetically loaded polymer). In some embodiments, the cavity can be filled (e.g., partially or completely) with filter material via an access within the fourth flex circuit board(s) 322 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

FIG. 4 depicts a cross-sectional view of an example flex circuit board 400 according to example embodiments of the present disclosure. The flex circuit board 400 can include one or more signal lines 406. The flex circuit board 400 can be configured to transmit signals by the one or more signal lines 406, such as through a vacuum chamber to couple one or more classical processors to quantum hardware. The flex circuit board 400 can include a plurality of signal lines 406 and can provide a significantly improved signal line density, in addition to providing improved isolation, reduced thermal conductivity, and/or improved scalability. For instance, including flex circuit board 400 according to example aspects of the present disclosure to couple classical processors to quantum hardware can provide for infrastructure that reliably scales to the increasingly greater numbers of qubits that are achieved and/or expected in contemporary and/or future quantum computing systems.

As used herein, a "flex circuit board" refers to a board including at least one generally planar substrate (e.g., layered substrates) or other support on which the one or more signal lines 406 are formed or otherwise disposed and having flexibility in at least one plane. As used herein, "flexibility" refers to a capability of deforming (e.g., subject to mechanical stress, etc.) without breaking. For example, a rectangular flex circuit board 400 may be flexible along a largest surface of the rectangular flex circuit board 400. A rectangular flex circuit board 400 may be flexible and/or rigid along at least a portion of its edges. The flexibility may be achieved as a property of material(s) from which the flex circuit board 400 and/or layers of the flex circuit board 400 is/are formed (e.g., metals, such as copper, copper alloys, niobium, aluminum, etc., dielectric materials, nonmetals, polymers, rubbers, etc.), achieved by hinging and/or segmenting of the flex circuit board 400 (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board 400 can include at least one ground layer 402. The ground layer 402 can form an outer surface of the flex circuit board 400, such as an outer surface along the largest surface. In some embodiments, the flex circuit board 400 can include two ground layers 402, such as two parallel and spaced apart ground layers 402. For instance, the two ground layers 402 can form both largest outer surfaces of the flex circuit board 400. A ground layer 402 can act as an electrical isolation layer to isolate signal lines 406 on one side of the ground layer 402 from interfering signals (e.g., from signal lines 406 on other layers, other boards, the environment, etc.) on another side of the ground layer 402. For instance, the ground layer 402 can be coupled to earth ground and/or other suitable ground(s).

The ground layer(s) 402 can be or can include any suitable electrically conductive material. In some embodiments, the ground layer(s) 402 can be or can include superconducting ground layer(s) 402 including superconducting material(s), such as superconducting material(s) that achieve(s) superconductivity at a temperature below about 3 kelvin, such as about 1 kelvin, such as less than about 20 millikelvin. As examples, the ground layer(s) 402 can be or can include niobium, tin, aluminum, and/or other suitable superconducting materials. Additionally and/or alternatively, the ground layer(s) 402 can be or can include material having high signal transfer performance characteristics, such as low resistance, low reflectivity, low distortion, etc. such that a signal is substantially unchanged by passing through the signal line. As examples, the ground layer(s) 402 can be or can include copper, gold, and/or other suitable materials having high signal transfer performance characteristics. Additionally and/or alternatively, the ground layer(s) 402 can be or can include material(s) having desirable thermal characteristics, such as suitably high and/or low thermal transfer, such as, for example, copper, copper alloy, thin superconducting materials, etc.

In some embodiments, the flex circuit board 400 can include at least one dielectric layer 404. The dielectric layer(s) 404 can be or can include any suitable dielectric material, such as dielectric polymers. In some embodiments, the dielectric layer(s) 404 can be or can include flexible dielectric material. As one example, the dielectric layer(s) 404 can be or can include polyimide. At least a portion of the dielectric layer(s) 404 can be formed on or otherwise disposed proximate to at least a portion of an inner surface of the ground layer(s) 402. For example, in some embodiments, an inner surface of a ground layer 402 can be mated with an outer surface of a dielectric layer 404. Furthermore, in some embodiments, inner surfaces of two dielectric layers 404 can be mated with signal lines 406 disposed therebetween.

The flex circuit board 400 can include one or more signal lines 406. The one or more signal lines 406 can be disposed on a surface (e.g., an inner surface) of at least one dielectric layer 404. As an example, in some implementations, the one or more signal lines 406 can be disposed between opposing inner surfaces of two dielectric layers 404. The signal line(s) 406 can be or can include any suitable electrically conductive material. In some embodiments, the signal line(s) 406 can be or can include superconducting signal line(s) 406 including superconducting material(s), such as superconducting material(s) that achieve(s) superconductivity at a temperature less than about 3 kelvin, such as about 1 kelvin, such as about 20 millikelvin. As examples, the signal line(s) 406 can be or can include niobium, tin, aluminum, molybdenum disulfide, BSCCO, and/or other suitable superconducting materials. Additionally and/or alternatively, the signal line(s) 406 can be or can include material having high signal transfer performance characteristics. As examples, the signal line(s) 406 can be or can include copper, gold, and/or other suitable materials having high signal transfer performance characteristics. Additionally and/or alternatively, the signal line(s) 406 can be or can include material(s) having desirable thermal characteristics, such as, for example, copper, copper alloy, etc.

In some embodiments, the flex circuit board 400 can include one or more vias (not illustrated). For instance, the via(s) can extend through the ground layer(s) 402, the dielectric layer(s) 404, and/or the signal line(s) 406. The via(s) can serve to improve isolation of the signal lines 406. In some embodiments, the via(s) can be plated with via plate(s) (not illustrated) that extend along the via(s). The via plate(s) can be any suitable material. For instance, in some embodiments, the via plate(s) can be or can include conductive material, such as copper.

In some embodiments, the flex circuit board 400 can include interconnect pads (not illustrated). The interconnect pads can couple to conductive material on flex circuit board 400, such as the ground layer(s) 402 and/or signal line(s) 406. Additionally and/or alternatively, via(s) in flex circuit board 400 can be plated with via plate(s) formed of a same material and/or formed concurrently with the interconnect pads. For instance, in some embodiments, the ground layer(s) 402 and/or signal line(s) 406 can be superconducting material and the interconnect pads can be material such as copper to provide improved interfacing with the superconducting ground layer(s) 402 and/or superconducting signal line(s) 406. For instance, this can resolve some difficulties associated with interfacing with and/or between superconducting materials. In some embodiments, adhesion layers (not illustrated) can be included between the interconnect pads and the conductive material (e.g., the ground layer(s) 402 and/or the signal line(s) 406). In some embodiments, the adhesion layer(s) can be a material that may be different from the material of the ground layer(s) 402 and/or signal line(s) 406 and/or the interconnect pads, such as titanium. In some embodiments, the interconnect pads can be formed of deposited copper, then electroplated copper. The interconnect pads may be deposited in a vacuum to prevent contamination of interfaces between the interconnect pads and the flex circuit board 400.

Figure 5:
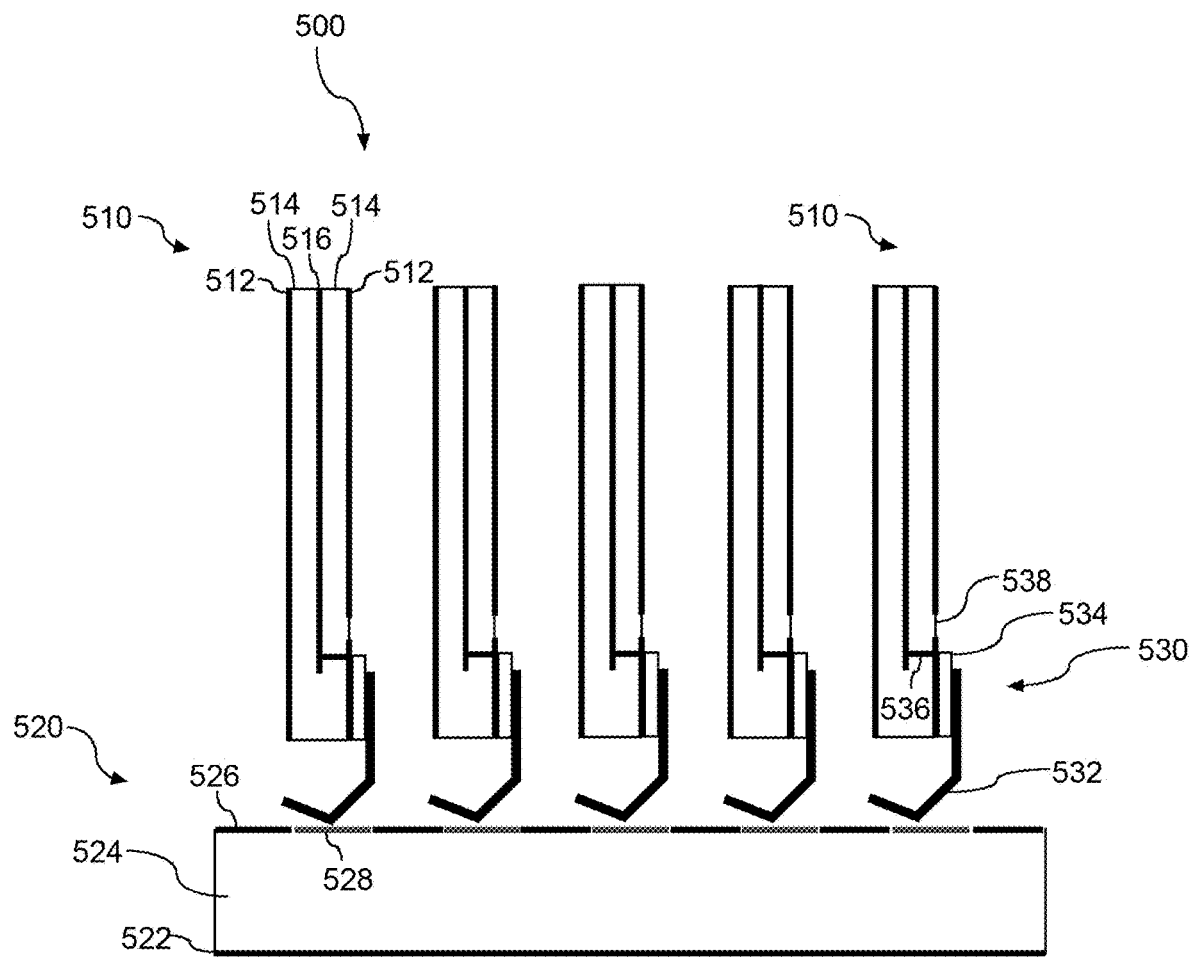
FIG. 5 depicts a cross-sectional view of an example T-joint connector according to example embodiments of the present disclosure.

FIG. 5 depicts a cross-sectional view of an example T-joint connector 500 according to example embodiments of the present disclosure. The T-joint connector 500 can be configured to couple one or more flex circuit boards 510 to a mounting circuit board 520. For instance, the T-joint connector 500 can be configured to connect multiple flex circuit boards 510 perpendicularly to a single mounting circuit board 520. This can provide for a high-density interconnect suitable for connecting large numbers of signal lines (e.g., from multiple boards) to a single board having relatively high signal line density while maintaining desirable signal transmission characteristics.

The flex circuit board(s) 510 may each include at least one ground layer 512, at least one dielectric layer 514, and/or one or more signal lines 516. For example, the flex circuit board(s) 510 may be flex circuit boards 400 of FIG. 4. In some embodiments, the ground layer(s) 512 and/or the signal line(s) 516 may be or include superconducting material at a temperature less than about 3 kelvin, such as aluminum, niobium, tin, molybdenum disulfide, BSCCO, etc.

The mounting circuit board 520 may be a flex circuit board as described herein (e.g., formed of one or more flexible substrates) and/or may be a rigid circuit board. The mounting circuit board 520 can include at least a ground layer 522 and a dielectric layer 524. The ground layer 522 and/or the dielectric layer 524 may be flexible and/or rigid. Additionally, a surface of the mounting circuit board 520 opposite the ground layer 522 can include one or more ground pads 526 and/or one or more signal pads 528. For example, the surface opposite the ground layer 522 can include a two-dimensional array of signal pads 528. Ground pads 526 may be arranged to provide isolation between the signal pads 528. For instance, the ground pads 526 may be arranged in spaces between the two-dimensional array of signal pads 528.

The T-joint connector can include one or more spring interconnects 530. The spring interconnect(s) 530 can be disposed on a surface of the flex circuit boards 510. The spring interconnect(s) 530 can couple to the signal line(s) 516 and/or be in electrical communication (e.g., signal communication) with the one or more signal line(s) 516. FIG. 5 depicts a cross-section of the T-joint connector 500, illustrating only one spring interconnect 530 per flex circuit board 510. It should be understood that, in some embodiments, a plurality of spring interconnects 530 can be spaced across a surface of the flex circuit board 510. For example, a line of spring interconnects 530 can couple to a corresponding line of signal pads 528 in a two-dimensional array of signal pads 528.

Each of the spring interconnect(s) 530 can include a spring element 532. In some embodiments, the spring element 532 can be attached to the flex circuit board 510 by a signal pad 534, such as a solder pad. The signal pad 534 can provide signal communications with the spring element 532. A via 536 can extend from signal line 516 to the signal pad 534 and/or the spring element 532. For example, the via 536 can provide signal communications between the signal line 516 and the spring element 532. In some embodiments, a gap 538 can be provided between the signal pad 534 and the ground layer 512 to isolate the ground layer 512 from the signal pad 534 and/or the spring element 532.

In some embodiments, the spring element 532 can include superconducting material at a temperature less than about 3 kelvin, such as less than about 1 kelvin, such as less than about 20 millikelvin. For example, in some embodiments, the spring element 532 can be formed of superconducting material. Additionally and/or alternatively, in some embodiments, the spring element 532 can include a coating of superconducting material, such as tin. For example, the spring element 532 may be formed of non-superconducting material (e.g., beryllium) and coated with superconducting material (e.g., tin). In this way, the spring element 532 can properly function as a spring using a material that has desirable mechanical properties (e.g., elasticity, tension, etc.) that may not be superconducting, while the superconducting coating can provide superconductivity, as the coating can be sufficient to provide superconductivity properties at the spring interconnect 530.

In some embodiments, the T-joint connector 500 can include one or more isolation plates (not illustrated) between the flex circuit boards 510. The isolation plates can isolate a first flex circuit board 510 from a second flex circuit board 510 and/or isolate a flex circuit board 510 from external interference. Additionally and/or alternatively, an isolation plate may be included between the flex circuit board(s) 510 and the mounting board 520. The isolation plate(s) may contact the mounting board 520 (e.g., ground pads 526) and/or another suitable ground such that the isolation plate(s) are grounded.

In some embodiments, the T-joint connector 500 may be self-aligned. For example, various aligning systems such as shims, tabs, connector hardware, etc. may be used to align the flex circuit board(s) 510 to the mounting circuit board 520 and/or to align the spring elements 532 to the signal pads 528. As one example, the flex circuit board(s) 510 and/or spring interconnect(s) 530 may be disposed in connector hardware configured to align the T-joint connector 500 to a mating interface on the mounting circuit board 520.

Figure 6A:
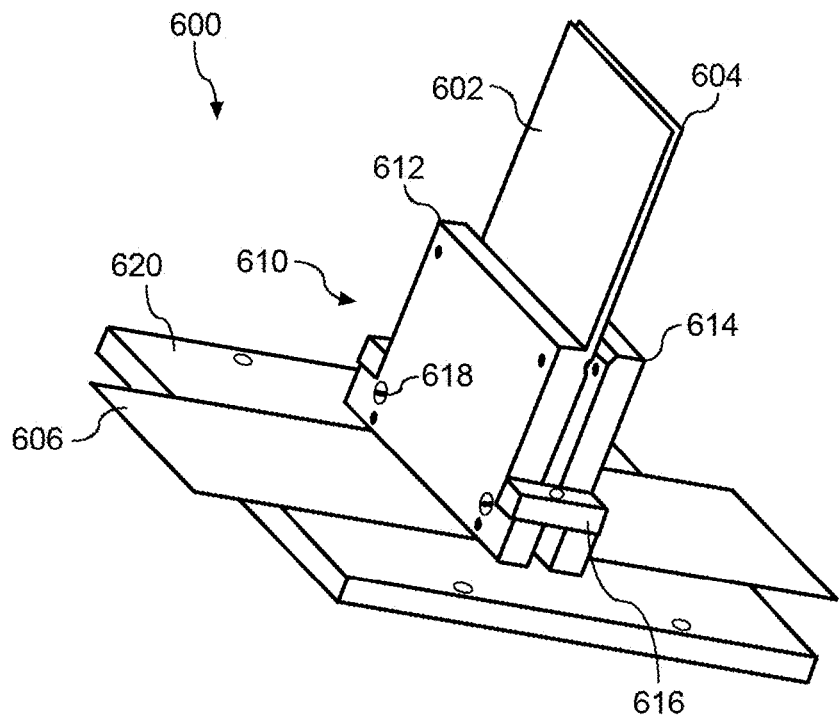
FIGS. 6A and 6B depict perspective views of an example T-joint connector according to example embodiments of the present disclosure.
Figure 6B:
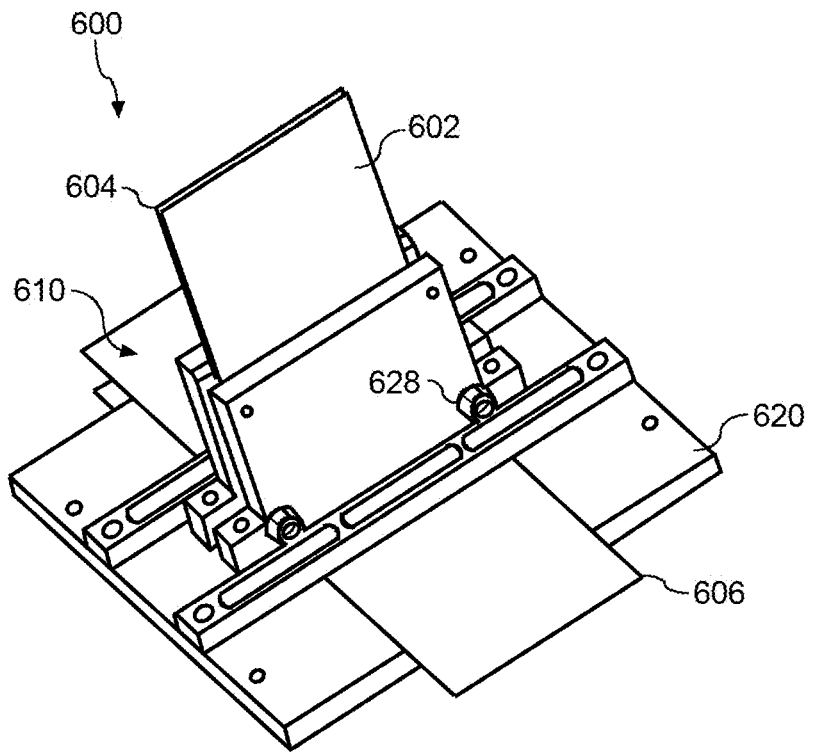

FIGS. 6A and 6B depict perspective views of an example T-joint connector 600 according to example embodiments of the present disclosure. As illustrated in FIG. 6A and FIG. 6B, the T-joint connector 600 includes a first flex circuit board 602 and a second flex circuit board 604. It should be understood that any suitable number of flex circuit board(s), such as one or more flex circuit boards, may be included in T-joint connector 600 according to example aspects of the present disclosure. The T-joint connector 600 can be configured to connect the flex circuit boards 602, 604 to mounting circuit board 606.

The T-joint connector 600 can include connector shell 610. For instance, connector shell 610 can attach to base 620 to connect the flex circuit boards 602, 604 to the mounting circuit board 606. The connector shell 610 can be configured to encase at least a portion of the flex circuit boards 602, 604. The connector shell can be configured to align the flex circuit boards 602, 604 to the mounting circuit board 606. For example, the connector shell 610 can be received by mounting hardware not illustrated) on the mounting circuit board 606 and/or proximate the mounting circuit board 606, such as on base 620, that couples with the connector shell 610 to align the flex circuit boards 602, 604 to the mounting circuit board 606.

The connector shell can include a first connector plate 612 and a second connector plate 614. The first connector plate 612 can be disposed parallel to the second connector plate 614 and/or spaced apart from the second connector plate 614 to define a volume therebetween. The volume can include, for example, the flex circuit boards 602, 604. For instance, the flex circuit boards 602, 604 can be disposed between the first connector plate 612 and the second connector plate 614. In some embodiments, a securing piece 616 can attach the first connector plate 612 to the second connector plate 614. Additionally and/or alternatively, the securing piece 616 can be configured to couple the connector plates 612, 614 to the base 620.

The T-joint connector 600 can include one or more through holes 618 extending through at least a portion of the T-joint connector 600. For instance, in some embodiments, the through holes 618 can extend through the first connector plate 612, at least a portion of the flex circuit boards 602 and/or 604, shim(s), and/or the second connector plate 614. In some embodiments, the through holes 618 can extend through only an edge of the flex circuit boards 602, 604 (or not extend through the flex circuit boards 602, 604) to prevent interference with signal lines in the flex circuit boards 602, 604. As illustrated in FIG. 6B, the through holes 618 can be configured to receive a rod assembly 628 to secure the first connector plate 612 to the second connector plate 614.

Figure 7:
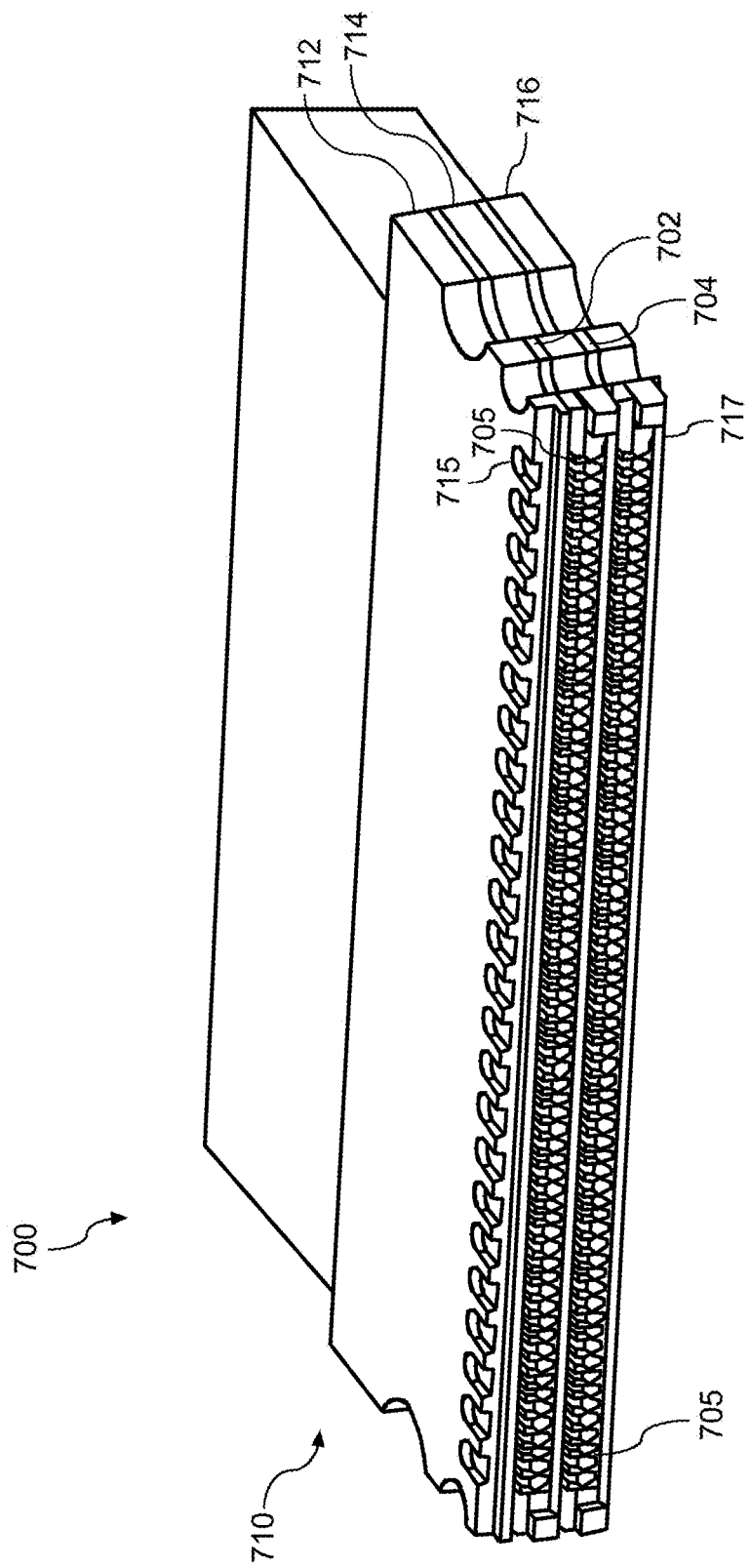
FIG. 7 depicts at least a portion of an example T-joint connector according to example embodiments of the present disclosure.

FIG. 7 depicts at least a portion of an example T-joint connector 700 according to example embodiments of the present disclosure. As illustrated in FIG. 7, the T-joint connector 700 includes a first flex circuit board 702 and a second flex circuit board 704. It should be understood that any suitable number of flex circuit board(s), such as one or more flex circuit boards, may be included in T-joint connector 700 according to example aspects of the present disclosure. The T-joint connector 700 can be configured to connect the flex circuit boards 702, 704 to a mounting circuit board (not illustrated).

The T-joint connector 700 can include one or more spring interconnects 705. The spring interconnect(s) 705 can be coupled to signal line(s) of flex circuit boards 702 and/or 704 and/or be in electrical communication (e.g., signal communication) with the signal line(s). For instance, a spring interconnect can be coupled to a respective signal line. The spring interconnect(s) can couple the signal line(s) to a mounting circuit board, such as to one or more signal pads disposed on the mounting circuit board. For instance, in some embodiments, some or all of the spring interconnect(s) 705 can include a spring element. For instance, the spring element can be configured to contact a respective signal pad disposed on the mounting circuit board to couple the signal line to the signal pad. In some embodiments, the spring element may compress, bend, retract, or otherwise be disposed such that tension resulting from mating the T-joint connector with the mounting circuit board establishes firm contact between the spring element and the signal pad.

The spring interconnect(s) 705 can include superconducting material, such as material that is superconducting (e.g., experiences superconductivity) at a temperature below about 3 kelvin, such as about 1 kelvin, such as about 20 millikelvin. For instance, in some embodiments, the spring element can include superconducting material. For example, in some embodiments, the spring element can be formed of superconducting material. Additionally and/or alternatively, in some embodiments, the spring element can include a superconducting coating of superconducting material. In some embodiments, the superconducting coating may include tin (e.g., as the superconducting material).

In some embodiments, a plurality of spring interconnects 705 can be spaced across a surface of the flex circuit board(s) 702 and/or 704. For example, a line of spring interconnects 705 can couple to a corresponding line of signal pads in a two-dimensional array of signal pads. In some embodiments, first flex circuit board 702 can include a plurality (e.g., a first plurality) of spring interconnects 705 that are spaced across a surface of the first flex circuit board 702 in a first direction. Additionally and/or alternatively, second flex circuit board 704 can be disposed parallel to the first flex circuit board 702. The second flex circuit board 704 can be spaced apart from the first flex circuit board 702 in a second direction. The second direction can be perpendicular to the first direction. Furthermore, in some embodiments, the second flex circuit board 704 can include a plurality (e.g., a second plurality) of spring interconnects 705 that are spaced across a surface of the second flex circuit board 704 in the first direction. For instance, the plurality of spring interconnects 705 spaced across the surface of the second flex circuit board 704 can be parallel to and/or aligned with the plurality of spring interconnects 705 spaced across the surface of the first flex circuit board 702.

The T-joint connector 700 can include shim assembly 710. Shim assembly 710 may be configured to be disposed within a connector shell, such as connector shell 610 of FIGS. 6A-6B and/or any other suitable connector shell. Shim assembly 710 can include one or more shims, such as shims 712, 714, and 716. The shim(s) 712, 714, 716 can be configured to space components of the T-joint connector 700, such as to align and/or separate various components of the T-joint connector 700. As one example, shim 714 can be configured to space first flex circuit board 702 apart from second flex circuit board 704. As another example, shims 712 and/or 716 can be configured to space a flex circuit board (e.g., flex circuit boards 702 and/or 704) apart from a portion of connector hardware, such as a connector shell, such as a first connector plate and/or a second connector plate. In some embodiments, the shim(s) 712, 714, 716 can be or can include non-conductive material.

In some embodiments, one or more tabs 715, 717 can extend from the shim(s) 712, 714, 716. The tab(s) 715, 717 can be configured to space apart the spring interconnect(s)

705. For instance, the shims 712, 714, 716 may space spring interconnects 705 that are spaced apart in a direction parallel to the flex circuit board(s) 702, 704 (e.g., spring interconnects 705 on the same flex circuit board) and/or spring interconnects 705 that are spaced apart in a direction perpendicular to the flex circuit board(s) 702, 704 (e.g., spring interconnects 705 on different flex circuit boards). Additionally and/or alternatively, the tab(s) 715, 717 can be configured to align the spring interconnect(s) 705 (e.g., the spring element(s)) to signal pad(s). For instance, the tabs 715, 717 can be disposed between adjacent spring interconnects 705 such that the spring interconnects 705 are prohibited from forming electrical connections with components other than respective signal pads. Additionally and/or alternatively, the tabs 715, 717 can facilitate aligned contact between the spring interconnects 705 (e.g., the spring element(s)) and the spring pads, such as by guiding the spring interconnects 705 against a respective signal pad when the T-joint connector 700 is mated with a mounting circuit board. In some embodiments, the tabs 715, 717 can be made of a same material as the shim(s) 712, 714, 716, such as non-conductive material.

Figure 8:
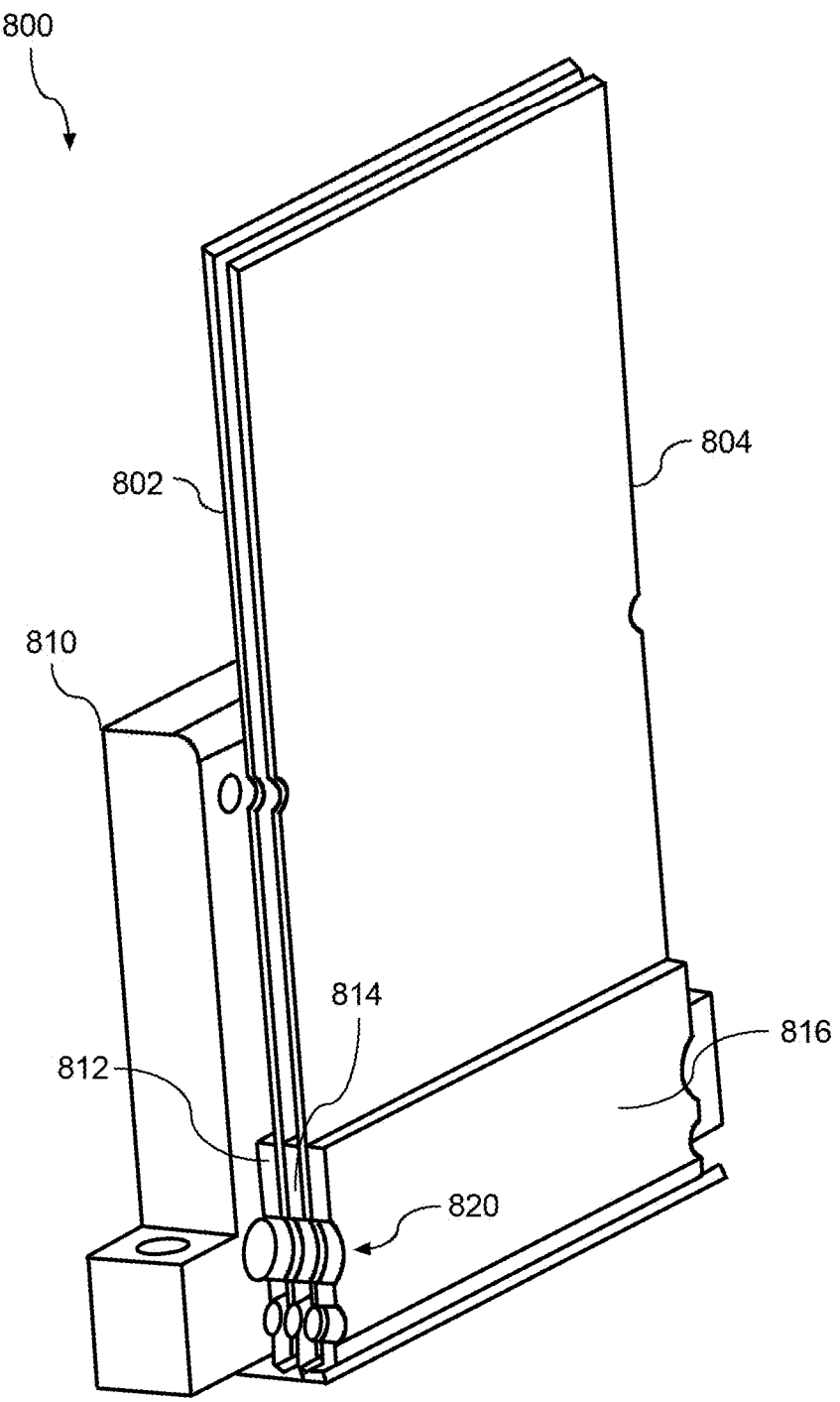
FIG. 8 depicts at least a portion of an example T-joint connector according to example embodiments of the present disclosure.

FIG. 8 depicts at least a portion of an example T-joint connector 800 according to example embodiments of the present disclosure. As illustrated in FIG. 8, the T-joint connector 800 includes a first flex circuit board 802 and a second flex circuit board 804. It should be understood that any suitable number of flex circuit board(s), such as one or more flex circuit boards, may be included in T-joint connector 800 according to example aspects of the present disclosure. The T-joint connector 800 can be configured to connect the flex circuit boards 802, 804 to a mounting circuit board (not illustrated).

The T-joint connector 800 can include connector plate 810. FIG. 8 depicts a connector with a second connector plate removed for the purposes of illustration. It should be understood that connector plate 810 can couple to another connector plate to secure the flex circuit boards 802, 804, as discussed herein (e.g., in FIGS. 6A-6B). Additionally, the T-joint connector 800 can include shims 812, 814, 816. The shim(s) 812, 814, 816 can be configured to space components of the T-joint connector 800, such as to align and/or separate various components of the T-joint connector 800. As one example, shim 814 can be configured to space first flex circuit board 802 apart from second flex circuit board 804. As another example, shims 812 and/or 816 can be configured to space a flex circuit board (e.g., flex circuit boards 802 and/or 804) apart from a portion of connector hardware, such as a connector shell, such as a first connector plate and/or a second connector plate. In some embodiments, the shim(s) 812, 814, 816 can be or can include non-conductive material.

The T-joint connector 800 can include one or more through holes 820 extending through at least a portion of the T-joint connector 800. For instance, as illustrated in FIG. 8, the through holes 820 can extend through the first connector plate 810, at least a portion of the flex circuit boards 802 and/or 804, and/or shim(s) 812, 814, 816. Additionally and/or alternatively, the through holes 820 can extend through a second connector plate. In some embodiments, such as is illustrated in FIG. 8, the through holes 820 can extend through only an edge of the flex circuit boards 802, 804 (or not extend through the flex circuit boards 802, 804) to prevent interference with signal lines in the flex circuit boards 802, 804. The through holes 820 can be configured to receive a rod assembly to secure the first connector plate 810 to a second connector plate.

Figure 9:
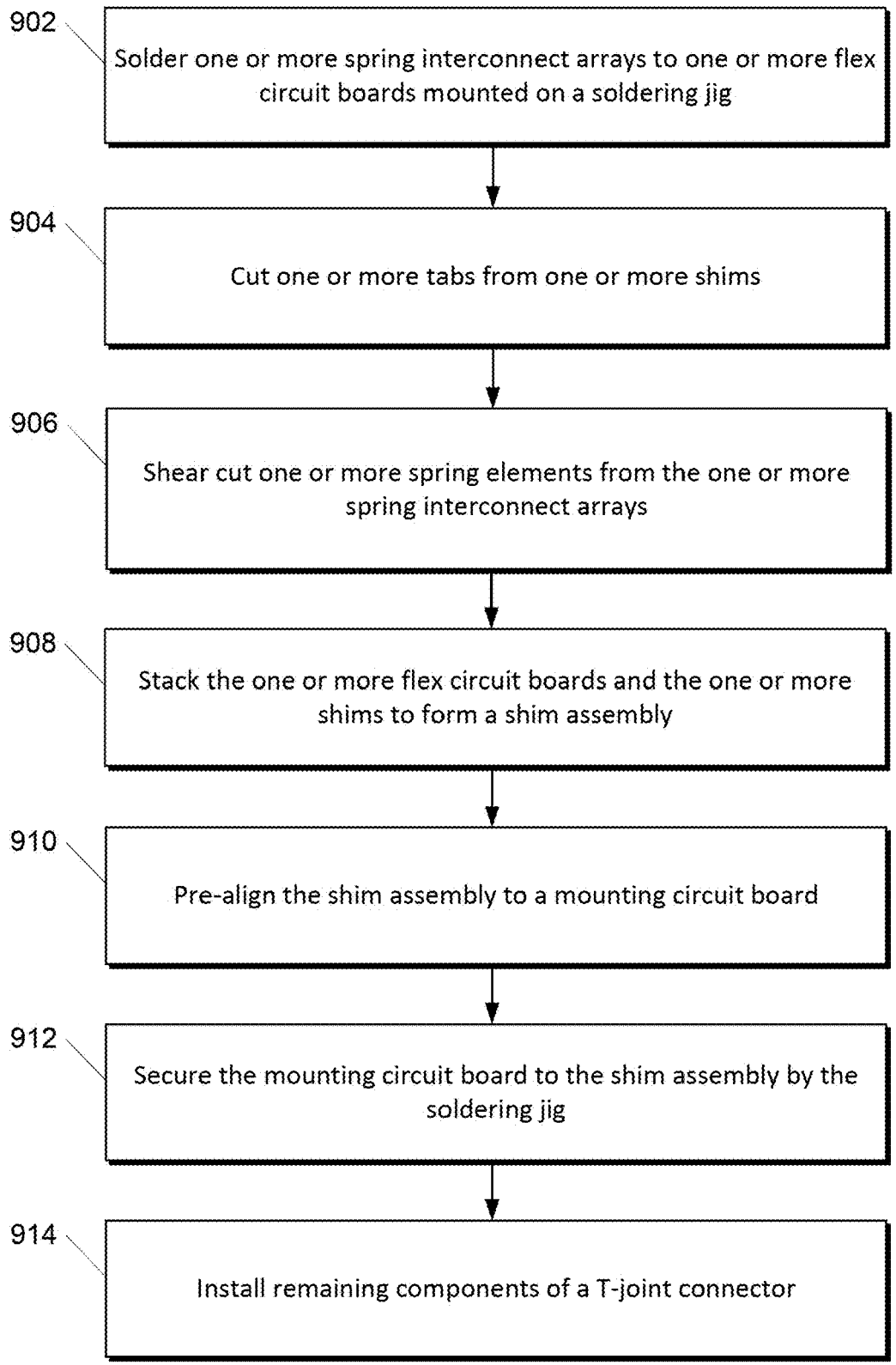
FIG. 9 depicts an example method of manufacturing a T-joint connector according to example embodiments of the present disclosure.

FIG. 9 depicts an example method 900 of manufacturing a T-joint connector according to example embodiments of the present disclosure. The method 900 can be implemented for any suitable T-joint connector, such as any of the T-joint connectors 500, 600, 700, or 800 depicted in FIGS. 5-8. FIG. 9 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

The method 900 can include, at 902, soldering one or more spring interconnect arrays to one or more flex circuit boards. For example, the spring interconnect array can include a plurality of spring interconnects as described herein. The spring interconnect array can be soldered to the flex circuit board with the assistance of a soldering jig, such as a soldering jig configured to secure the flex circuit board and allowing access to contact regions of the spring interconnect array. In some embodiments, a paste mask the size of a signal pad can be used. The paste mask may be positioned inside of a laser-cut board. In some embodiments, solder mask tape (e.g., Kapton tape) can be applied to a ground layer to prevent contamination of the ground layer.

The method 900 can include, at 904, cutting one or more tabs from one or more shims. For example, the tabs can be cut using a cutting tool, such as scissors. The tabs can be cut at a second bend of the spring interconnects such that the tabs can fit on sheared springs.

The method 900 can include, at 906, shear cutting one or more spring elements from the one or more spring interconnect arrays. For example, the spring elements can be formed from a continuous spring interconnect array, such as a bent sheet of metal.

The method 900 can include, at 908, stacking one or more flex circuit boards and/or one or more shims to form a shim assembly. For example, the boards and/or shims can be stacked with the assistance of one or more dowels to align the boards and/or shims. As one example, the boards and shims having tabs cut out can be alternated. Shims without tabs can be included at the ends of the stacks (e.g., to fit between the external boards and a connector shell).

The method 900 can include, at 910, pre-aligning the shim assembly to a mounting circuit board. For example, the shim assembly can be aligned with mounting hardware on the mounting circuit board that will be configured to receive the T-joint connector. For instance, the tabs cut on the shims can be used to align the flex circuit boards to the mounting circuit board.

The method 900 can include, at 912, securing the mounting circuit board to the shim assembly. For example, the mounting circuit board can be secured to a base of the soldering jig. In some embodiments, the mounting circuit board can be secured with clamps.

The method 900 can include, at 914, installing remaining components of the T-joint connector. For instance, after the mounting circuit board is secured, the spring interconnects can be installed and aligned. In some embodiments, clamps can be used to secure additional components.

Figure 10:
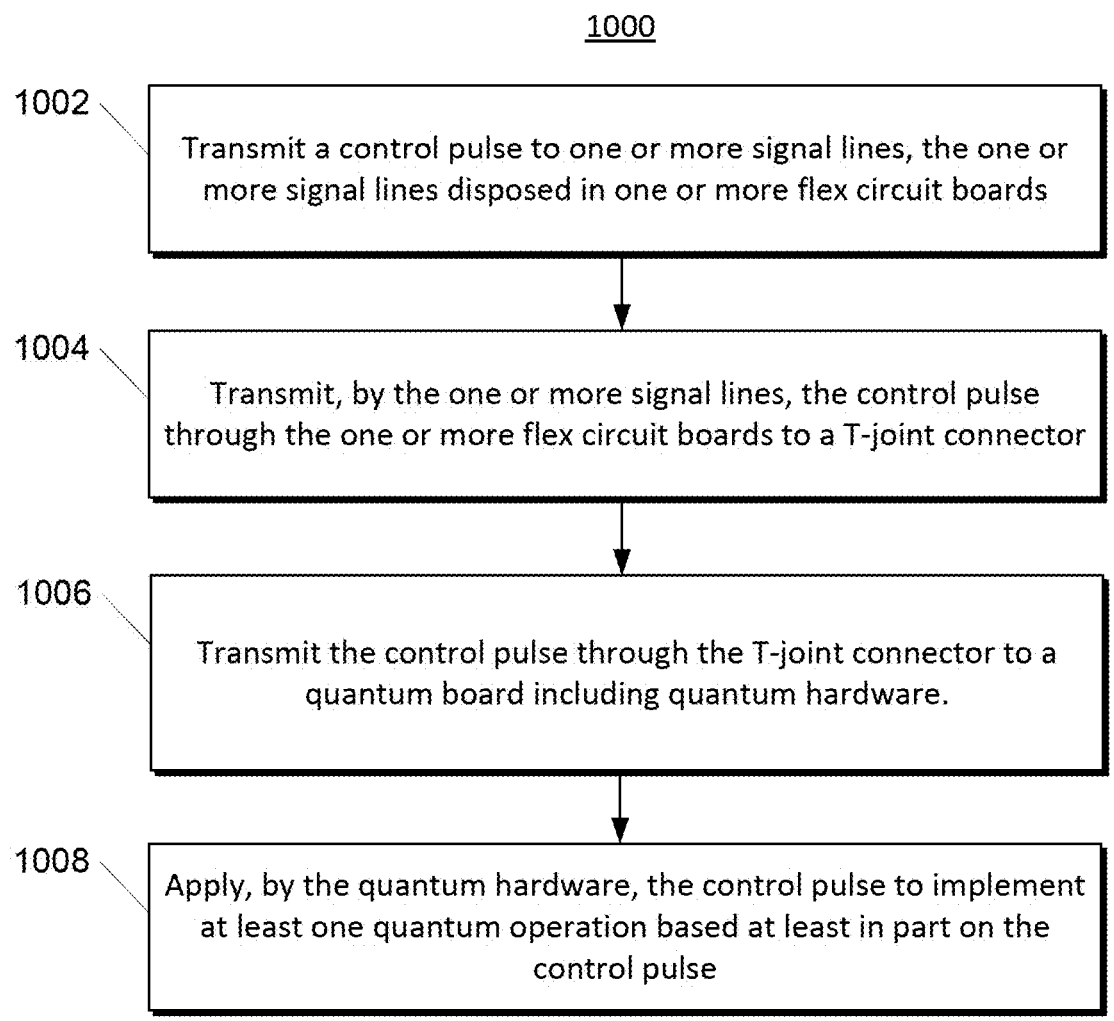
FIG. 10 depicts an example method of operating a quantum computing system including a T-joint connector according to example embodiments of the present disclosure

FIG. 10 depicts an example method of operating a quantum computing system including a T-joint connector according to example embodiments of the present disclosure. The method 1000 can be implemented using any suitable quantum computing system, such as any of the quantum computing systems 100 or 300 depicted in FIGS. 1-3. FIG. 10 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

The method 1000 can include, at 1002, transmitting a control pulse to one or more signal lines. For example, the control pulse can be transmitted by one or more classical processors coupled to the signal line(s). The control pulse can be or can include classical (e.g., binary) computer-readable signal data, such as a voltage signal, and/or signals that are implementable by quantum computing devices. The signal line(s) can be disposed in one or more flex circuit boards. For example, the flex circuit boards can be any suitable flex circuit boards discussed herein, such as flex circuit boards 400 of FIG. 4. The flex circuit boards may be disposed in any suitable quantum computing system, such as quantum computing systems 100 and/or 300 of FIGS. 1-3.

The method 1000 can include, at 1004, transmitting the control pulse through the one or more flex circuit boards to a T-joint connector. For example, the control pulse can be transmitted through the signal line(s) in the one or more flex circuit boards to the T-joint connector. The T-joint connector can be any suitable T-joint connector, such as T-joint connectors 500, 600, 700, 800 of FIGS. 5-8. The control pulse can be transmitted, by the signal line(s), through a temperature gradient in a vacuum chamber. For instance, the signal line(s) carrying the control pulse can be progressively decreasing in temperature from the classical processor(s) (e.g., at room temperature and/or a temperature on the order of about 100 kelvin) to the connector (e.g., at a temperature of less than about 1 kelvin, such as about 10 mK).

The method 1000 can include, at 1006, transmitting the control pulse through the T-joint connector to a quantum board including quantum hardware. For example, the control pulse can be transmitted through spring interconnect(s) (e.g., superconducting spring interconnect(s)) of the T-joint connector that are coupled to the signal line(s) of the flex circuit boards. The quantum hardware may be kept at a same temperature or a near-same temperature as the T-joint connector.

The method 1000 can include, at 1008, applying the control pulse to implement at least one quantum operation based at least in part on the control pulse. As one example, in some embodiments, the quantum operation(s) can be or can include obtaining state measurement(s) of the quantum computing device(s). For instance, the control pulse can instruct the quantum computing device(s) to measure the quantum state and/or resolve the quantum state to a basis state representation. Additionally, the measured quantum state can be transmitted (e.g., by the signal lines and through the T-joint connector) to the classical processor(s).

As another example, in some embodiments, the quantum operation(s) can be or can include implementing at least one quantum gate operation by and/or at the quantum computing device(s). For instance, the control pulse can be descriptive of microwave pulses that are applied to the quantum computing device(s) (e.g., qubits) to perform quantum gating operations. Example quantum gating operations include, but are not limited to, Hadamard gates, controlled-NOT (CNOT) gates, controlled-phase gates, T gates, multi-qubit quantum gates, coupler quantum gates, etc.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A T-joint connector for connecting one or more flex circuit boards to quantum hardware comprising one or more qubits, each of the one or more flex circuit boards comprising a plurality of signal lines, the T-joint connector comprising:
a plurality of spring interconnects each comprising a superconducting material, wherein each spring interconnect of the plurality of spring interconnects is coupled to a respective one of the plurality of signal lines;
wherein each spring interconnect of the plurality of spring interconnects is configured to couple the respective one of the plurality of signal lines to a respective one of a plurality of signal pads disposed on a mounting circuit board associated with the quantum hardware;
wherein the superconducting material is superconducting at a temperature less than about 3 kelvin.

2. The T-joint connector of claim 1, wherein one or more signal lines of the plurality of signal lines are superconducting signal lines.

3. The T-joint connector of claim 1, wherein one or more spring interconnects of the plurality of spring interconnects comprise one or more spring elements, the one or more spring elements comprising a superconducting coating.

4. The T-joint connector of claim 3, wherein the one or more spring elements comprise a non-superconducting material.

5. The T-joint connector of claim 3, wherein the one or more spring elements comprise beryllium copper.

6. The T-joint connector of claim 3, wherein the superconducting coating comprises tin.

7. The T-joint connector of claim 1, wherein a first flex circuit board of the one or more flex circuit boards comprises a first plurality of spring interconnects spaced across a surface of the first flex circuit board in a first direction.

8. The T-joint connector of claim 7, wherein a second flex circuit board of the one or more flex circuit boards is disposed parallel to the first flex circuit board and spaced apart from the first flex circuit board in a second direction, the second direction being perpendicular to the first direction.

9. The T-joint connector of claim 1, wherein the plurality of signal pads comprises a two-dimensional array of signal pads.

10. The T-joint connector of claim 1, wherein the T-joint connector comprises at least one shim configured to space a first flex circuit board apart from a second flex circuit board.

11. The T-joint connector of claim 10, comprising one or more tabs extending from the at least one shim, the one or more tabs configured to space the plurality of spring interconnects and align the plurality of spring interconnects to the plurality of signal pads.

12. The T-joint connector of claim 1, wherein an isolation plate is configured to electrically isolate a first flex circuit board of the one or more flex circuit boards from a second flex circuit board of the one or more flex circuit boards.

13. The T-joint connector of claim 12, wherein the isolation plate comprises superconducting material.

14. The T-joint connector of claim 1, further comprising a connector shell configured to encase at least a portion of the one or more flex circuit boards, wherein the connector shell is further configured to align the one or more flex circuit boards to the mounting circuit board.

15. The T-joint connector of claim 14, wherein the connector shell comprises:
a first connector plate; and
a second connector plate;
wherein the first connector plate is disposed parallel to the second connector plate and spaced apart from the second connector plate;
wherein one or more flex circuit boards are disposed between the first connector plate and the second connector plate.

16. The T-joint connector of claim 15, wherein one or more shims are configured to separate the one or more flex circuit boards from at least one of the first connector plate and the second connector plate.

17. The T-joint connector of claim 15, comprising one or more through holes extending through the first connector plate, at least a portion of the one or more flex circuit boards, and the second connector plate, wherein the one or more through holes are configured to receive a rod assembly to secure the first connector plate to the second connector plate.

18. The T-joint connector of claim 1, wherein the flex circuit boards further comprise:
a first ground layer;
a first dielectric layer formed on a surface of the first ground layer;
a second ground layer; and
a second dielectric layer formed on a surface of the second ground layer;
wherein the one or more signal lines are disposed between the first dielectric layer and the second dielectric layer.

19. A method of operating a quantum computing system, comprising:
transmitting a control pulse to one or more signal lines, the one or more signal lines disposed in one or more flex circuit boards;
transmitting, by the one or more signal lines, the control pulse through the one or more flex circuit boards to a T-joint connector;
transmitting the control pulse through the T-joint connector to a quantum board comprising quantum hardware; and
applying, by the quantum hardware, the control pulse to implement at least one quantum operation based at least in part on the control pulse;
wherein the T-joint connector comprises:
a plurality of spring interconnects each comprising a superconducting material, wherein each spring interconnect of the plurality of spring interconnects is coupled to a respective one of the plurality of signal lines;

wherein each spring interconnect of the plurality of spring interconnects is configured to couple the respective one of the plurality of signal lines to a respective one of a plurality of signal pads disposed on a mounting circuit board associated with the quantum hardware;

wherein the superconducting material is superconducting at a temperature less than about 3 kelvin.

20. A quantum computing system, comprising:

one or more classical processors;

quantum hardware comprising one or more qubits;

a chamber mount configured to support the quantum hardware;

a vacuum chamber configured to receive the chamber mount and dispose the quantum hardware in a vacuum, the vacuum chamber forming a cooling gradient from an end of the vacuum chamber to the quantum hardware;

a plurality of flex circuit boards each comprising a respective plurality of signal lines, each of the plurality of flex circuit boards configured to transmit signals by the respective plurality of signal lines through the vacuum chamber; and a T-joint connector configured to couple the plurality of flex circuit boards to the quantum hardware, the T-joint connector comprising a plurality of spring interconnects comprising a superconducting material, each spring interconnect of the plurality of spring interconnects coupled to a respective signal line of the respective pluralities of signal lines;

wherein each spring interconnect of the plurality of spring interconnects is configured to couple a respective one of the plurality of signal lines to a respective one of a plurality of signal pads disposed on a mounting circuit board associated with the quantum hardware;

wherein the superconducting material is superconducting at a temperature less than about 3 kelvin.

* * * * *